US012772439B2

(12) United States Patent
Shih et al.

(10) Patent No.: US 12,772,439 B2
(45) Date of Patent: Oct. 20, 2026

(54) SEMICONDUCTOR DEVICE HAVING TRENCH CAPACITORS FORMED ON CHANNEL STRUCTURES AND METHODS FOR MANUFACTURING THE SAME

(71) Applicant: NANYA TECHNOLOGY CORPORATION, New Taipei City (TW)

(72) Inventors: Chiang-Lin Shih, New Taipei City (TW); Yu-Ting Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 379 days.

(21) Appl. No.: 18/380,919

(22) Filed: Oct. 17, 2023

(65) Prior Publication Data

US 2024/0315012 A1 Sep. 19, 2024

Related U.S. Application Data

(62) Division of application No. 18/120,511, filed on Mar. 13, 2023.

(51) Int. Cl.
*H10B 12/00* (2023.01)

(52) U.S. Cl.
CPC ........... *H10B 12/37* (2023.02); *H10B 12/315* (2023.02); *H10B 12/482* (2023.02); *H10B 12/488* (2023.02)

(58) Field of Classification Search
CPC .... H10B 12/37; H10B 12/315; H10B 12/482; H10B 12/488; H10B 12/02; H10B 12/038
See application file for complete search history.

(56) References Cited

U.S. PATENT DOCUMENTS

| | | | | |
|---|---|---|---|---|
| 2016/0064384 | A1 | 3/2016 | Park et al. | |
| 2022/0013525 | A1* | 1/2022 | Cho | H10B 12/03 |
| 2022/0093614 | A1 | 3/2022 | Liu et al. | |
| 2022/0223732 | A1* | 7/2022 | Ryu | H10B 12/05 |
| 2023/0058819 | A1 | 2/2023 | Lee et al. | |
| 2023/0061185 | A1* | 3/2023 | Jeon | H10D 1/68 |

(Continued)

FOREIGN PATENT DOCUMENTS

| | | | |
|---|---|---|---|
| TW | 202213714 | A | 4/2022 |
| TW | 202245069 | A | 11/2022 |

OTHER PUBLICATIONS

Office Action and Search Report mailed on Apr. 15, 2024 related to Taiwanese Application No. 112121652.

(Continued)

*Primary Examiner* — Mohammed R Alam
(74) *Attorney, Agent, or Firm* — Xuan Zhang

(57) ABSTRACT

A semiconductor device and a method for manufacturing the same are provided. The semiconductor device includes a substrate, a first bit line disposed on the substrate and extending along a first direction, a first word line disposed on the first bit line and extending along a second direction perpendicular to the first direction, a channel structure disposed on the first bit line and penetrating the first word line, and a trench capacitor disposed on the channel structure. The channel structure is separated from the first word line by a gate dielectric layer.

16 Claims, 14 Drawing Sheets

A

(56) References Cited

U.S. PATENT DOCUMENTS

2023/0069096 A1* 3/2023 Yang ...................... H10B 12/50

OTHER PUBLICATIONS

Office Action and Search Report mailed on May 28, 2024 related to Taiwanese Application No. 113105121.
Office Action and Search Report mailed on Jul. 29, 2024 related to Taiwanese Application No. 112121652.
Office Action and and the search report mailed on Dec. 3, 2025 related to U.S. Appl. No. 18/120,511, wherein this application is a DIV of U.S. Appl. No. 18/120,511.

* cited by examiner

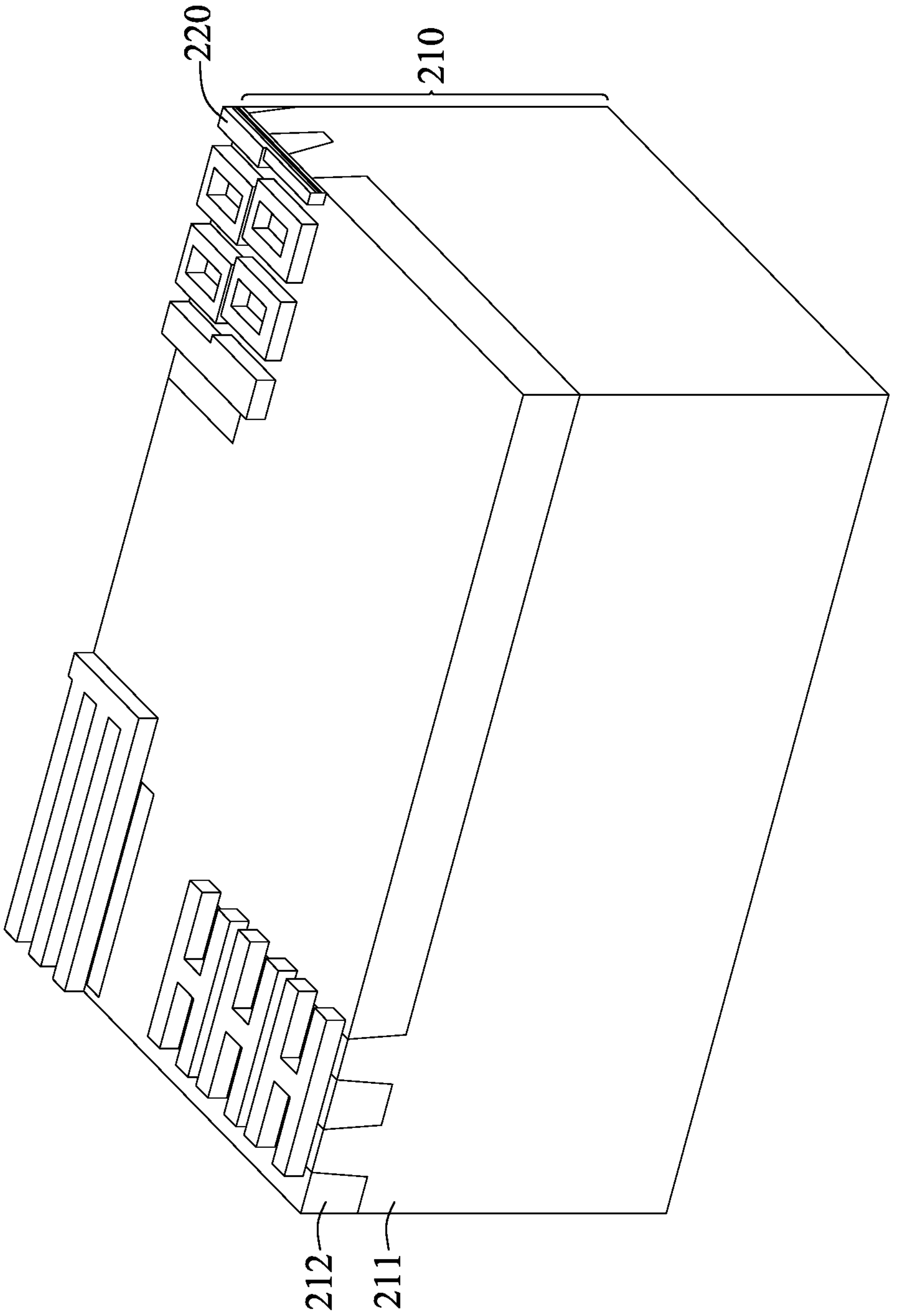
FIG. 3A
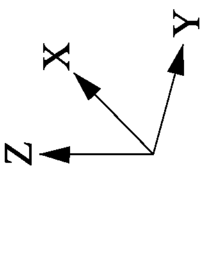

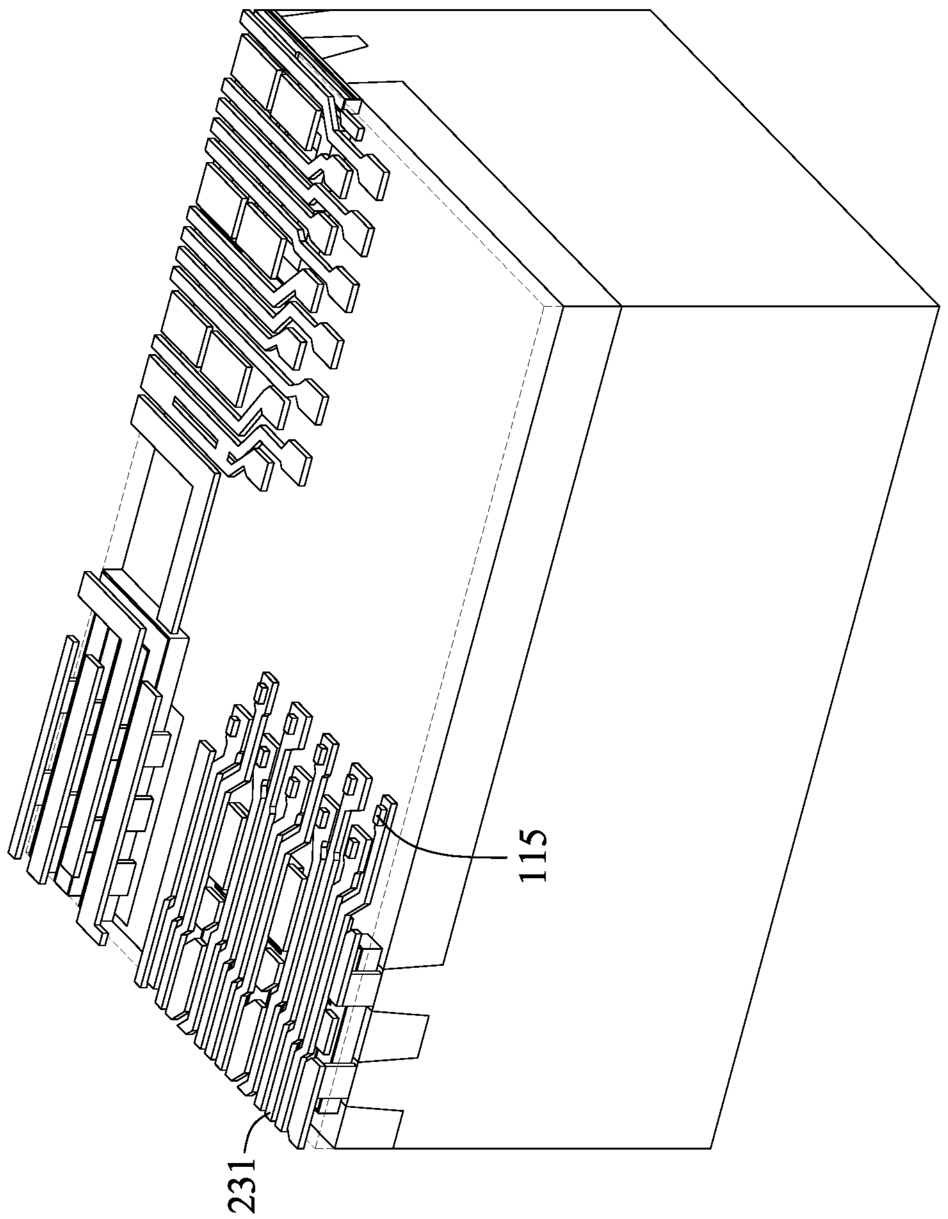
FIG. 3C
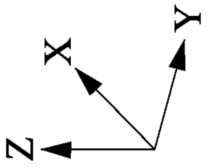

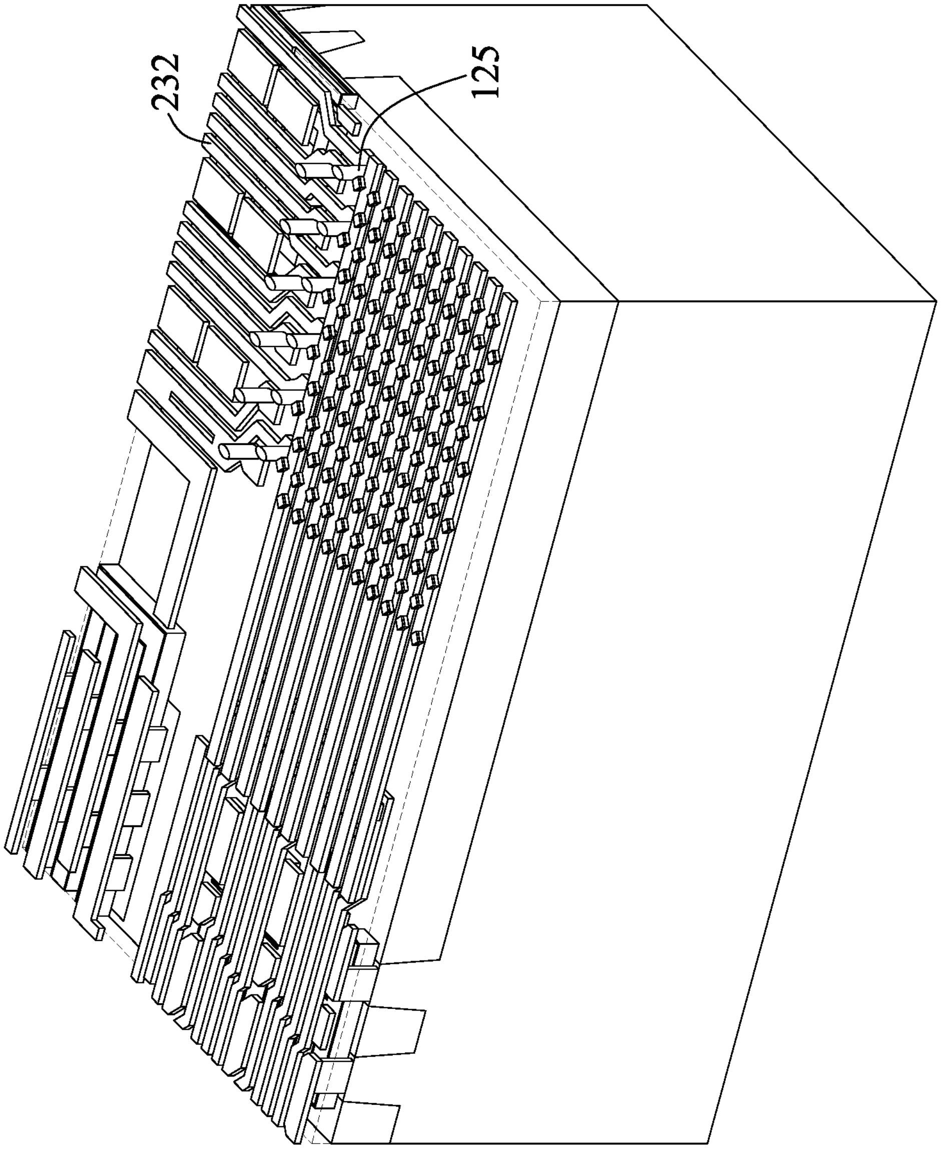
FIG. 3E
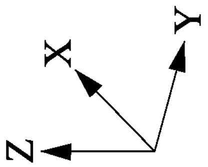

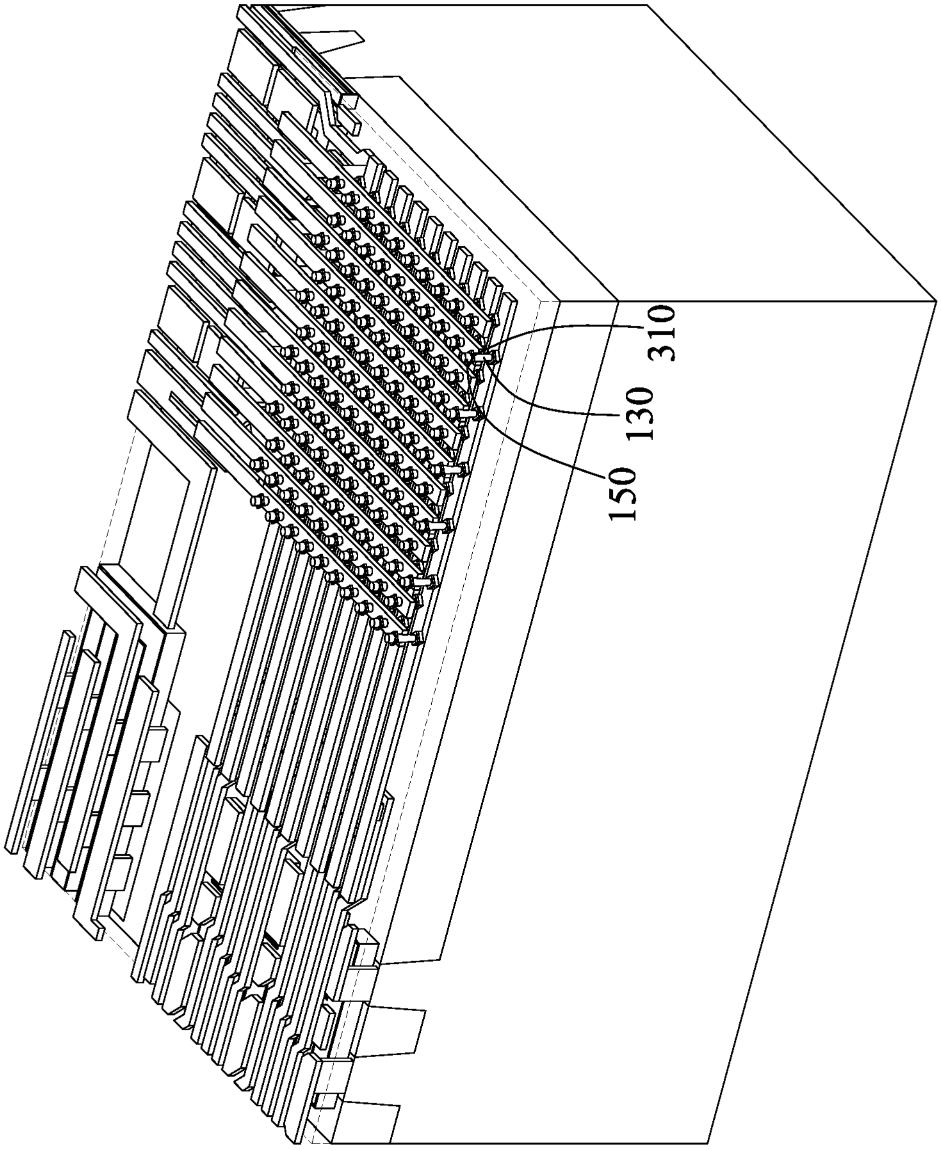
FIG. 3G
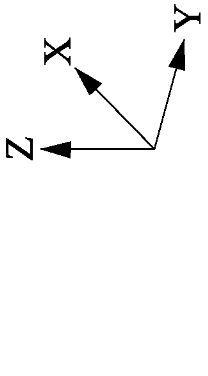

SEMICONDUCTOR DEVICE HAVING TRENCH CAPACITORS FORMED ON CHANNEL STRUCTURES AND METHODS FOR MANUFACTURING THE SAME

CROSS-REFERENCE TO RELATED APPLICATION

This application is a divisional application of U.S. Non-Provisional application Ser. No. 18/120,511 filed Mar. 13, 2023, which is incorporated herein by reference in its entirety.

TECHNICAL FIELD

The present disclosure relates to a semiconductor device and a method of manufacturing the same, and more particularly, to a semiconductor device having a trench capacitor formed on a channel structure.

DISCUSSION OF THE BACKGROUND

An Oxide Semiconductor Random Access Memory (OSRAM) device is a type of random access memory that stores each bit of data in a separate capacitor within an integrated circuit. Typically, an OSRAM is arranged in an array of one capacitor and transistor per cell. In current architecture of OSRAM, the capacitors are manufactured first. However, recently, OSRAM manufacturers face increasing challenges to improve performance as well as yield for memory cells. For example, the channel of a bit line can be prone to contact with a word line, which can induce a short circuit due to overlay errors in the lithography process.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a first bit line disposed on the substrate and extending along a first direction, a first word line disposed on the first bit line and extending along a second direction perpendicular to the first direction, a channel structure disposed on the first bit line and penetrating the first word line, and a trench capacitor disposed on the channel structure. The channel structure is separated from the first word line by a gate dielectric layer.

Another aspect of the present disclosure provides a semiconductor device. The semiconductor device includes a substrate, a channel structure disposed on the substrate, a first word line disposed on the substrate and surrounding the channel structure, and a trench capacitor disposed on the channel structure, opposite to the substrate. The channel structure tapers along a first direction away from the trench capacitor.

Another aspect of the present disclosure provides a semiconductor device. The semiconductor device includes a substrate, a first bit line disposed on the substrate, a first landing pad disposed on the first bit line, a second landing pad disposed above the first landing pad, and a channel structure disposed between the first landing pad and the second landing pad.

Another aspect of the present disclosure provides a method for manufacturing a semiconductor device. The method includes providing a substrate; forming a first bit line on the substrate, wherein the first bit line extends along a first direction; forming a first word line above the first bit line, wherein the first word line extends along a second direction perpendicular to the first direction; forming a channel structure on the first bit line, wherein the channel structure penetrates the first word line; and forming a trench capacitor on the channel structure.

The embodiments of the present disclosure provide a semiconductor device with the capacitor formed last, thereby differentiating process and structure thereof from current practice. For example, in the current practice, the contact connecting the memory array to other elements is manufactured by stacking several contacts and stages, while the present disclosure provides a monolithic contact connecting to the memory array, whereby misaligned (failed) contacts can be avoided. Furthermore, as the word line of the present disclosure is close to the lower conductive layers on the substrate, the resistance of the connection can be reduced due to the shortened electrical path (shorter word line contact).

As to the potential failure of channel structure, the etching process for manufacturing the channel structure may be not deep enough; in such case, the bottom surface of the channel structure can contact the word line, such that the channel structure and the word line are shorted. In current practice, since the bit line is disposed on the channel structure, a short circuit may occur between the bit line and the word line through the failed channel structure, and thus other channel structures connected to the same bit line would fail as well. The present disclosure provides a semiconductor device with the capacitor formed last (i.e., the capacitor disposed on the channel structure). In this case, a short circuit may occur between the word line and the capacitor (instead of the bit line) through the failed channel structure, and thus only one memory cell (containing the failed channel structure) would be impacted. Accordingly, yield and performance of the semiconductor device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 3A, FIG. 3B, FIG. 3C, FIG. 3D, FIG. 3E, FIG. 3F, FIG. 3G, and FIG. 3H illustrate one or more operations of a method for manufacturing a semiconductor device, in accordance with some comparative embodiments of the present disclosure.

DETAILED DESCRIPTION

Figure 1A:
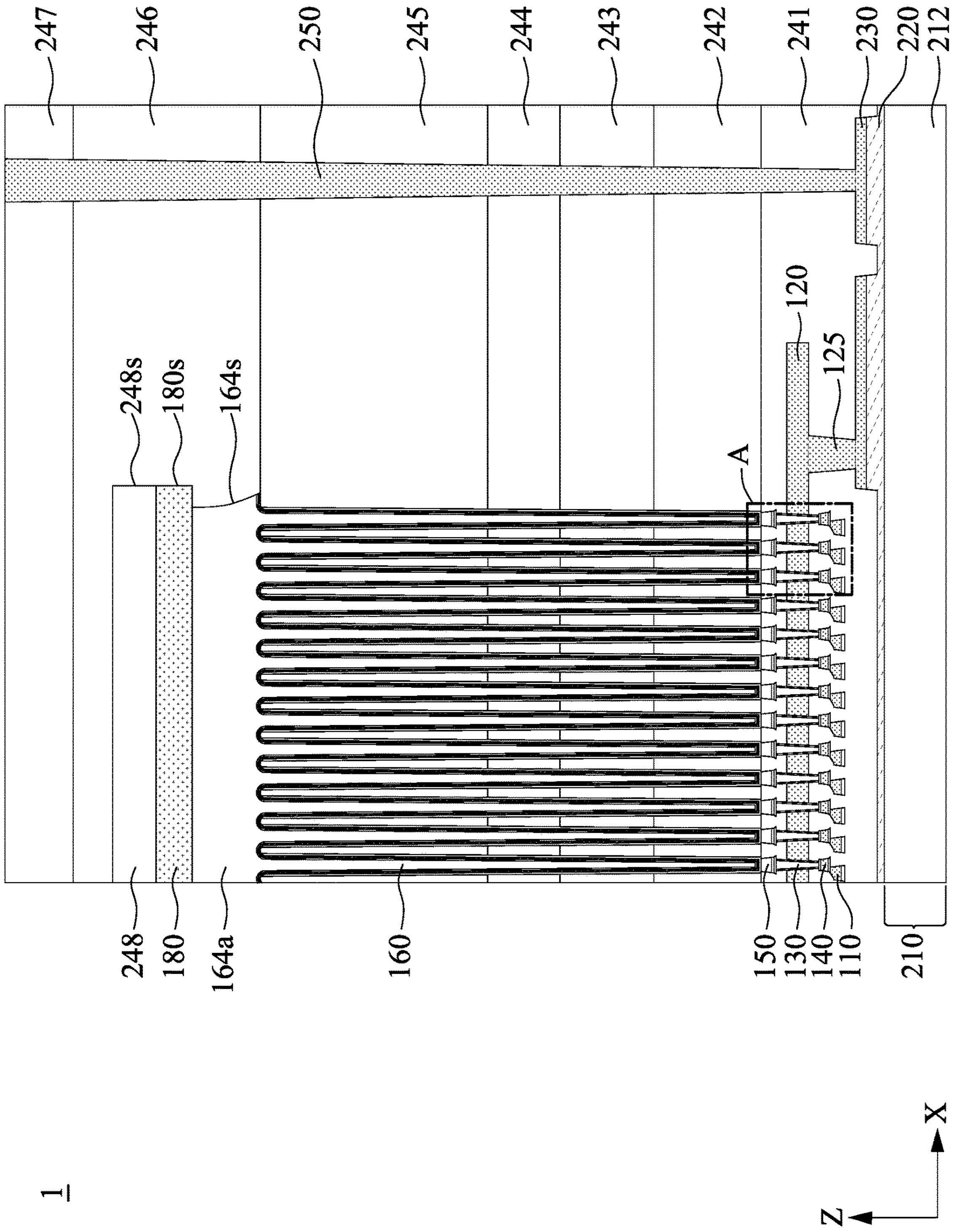
FIG. 1A is a cross-section of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A is a cross-section of a semiconductor device 1, in accordance with some embodiments of the present disclosure.

The semiconductor device 1 can include a memory, memory device, memory die, memory chip, or other components. The semiconductor device 1 can be a portion of memory, memory device, memory die, or memory chip. For example, the memory can be a dynamic random access memory (DRAM). In some embodiments, the DRAM can be a double data rate fourth generation (DDR4) DRAM. In some embodiments, the memory can be an oxide semiconductor random access memory (OSRAM). In some embodiments, the memory includes one or more memory cells (or memory bits, memory blocks).

The semiconductor device 1 includes a substrate 210, conductive layers 220 and 230, dielectric layers 241, 242, 243, 244, 245, 246, and 247, bit lines 110, a word line 120, a word line contact 125, channel structures 130, lower landing pads 140, upper landing pads 150, trench capacitors 160, a contact layer 164*a*, a conductive layer 180, a dielectric layer 248, and a contact 250.

Referring to FIG. 1A, the substrate 210 may be a semiconductor substrate, such as a bulk semiconductor, a semiconductor-on-insulator (SOI) substrate, or the like. The substrate 210 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other appropriate materials; or a combination thereof. In some embodiments, the alloy semiconductor substrate may be a SiGe alloy with a gradient Ge feature in which the Si and Ge composition changes from one ratio at one location to another at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 210 may be multilayered, or the substrate 210 may include a multilayered compound semiconductor structure.

In some embodiments, the substrate 210 can include an isolation structure 212 and a plurality of active areas (not shown). Relationship between the isolation structure 212 and the substrate 210 would be clearer in view of FIG. 3A. In some embodiments, the isolation structure 212 can include, for example, silicon oxide ($SiO_2$), silicon nitride ($Si_3N_4$), silicon oxynitride ($N_2OSi_2$), silicon nitride oxide ($N_2OSi_2$), or other appropriate materials. The active area can function as, for example, a channel for electrical connection. In some embodiments, the plurality of active areas can be separated by the isolation structures 212.

The conductive layer 220 can be disposed on the substrate 210. In some embodiments, the conductive layer 220 can be disposed on the isolation structure 212 of the substrate 210. In some embodiments, the conductive layer 220 can be electrically connected to the active areas of the substrate 210 (not shown). The conductive layer 220 can be a patterned layer. That is, the conductive layer 220 can expose a part of the substrate 210 (not shown in FIG. 1A).

The conductive layer 220 can include metal, such as W, Cu, Ru, Ir, Ni, Os, Rh, Al, Mo, Co, alloys thereof, combinations thereof or any metallic material with appropriate resistance and gap-fill capability.

In some embodiments, another conductive layer 230 can be formed on the conductive layer 220. In some embodiments, the conductive layer 230 can be electrically connected to the active areas of the substrate 210 through the conductive layer 220 (not shown). The conductive layer 230 can be a patterned layer corresponding to that of the conductive layer 220.

The conductive layer 230 can be of material similar or identical to the conductive layer 220. For example, the conductive layer 220 can include copper (Cu), and the conductive layer 230 can include tungsten (W).

The semiconductor device 1 can include an array of transistors (for example, region "A") disposed on the substrate 210. The array of transistors can include the bit lines 110, lower landing pads 140, channel structures 130, word line 120, and upper landing pads 150.

Figure 1B:
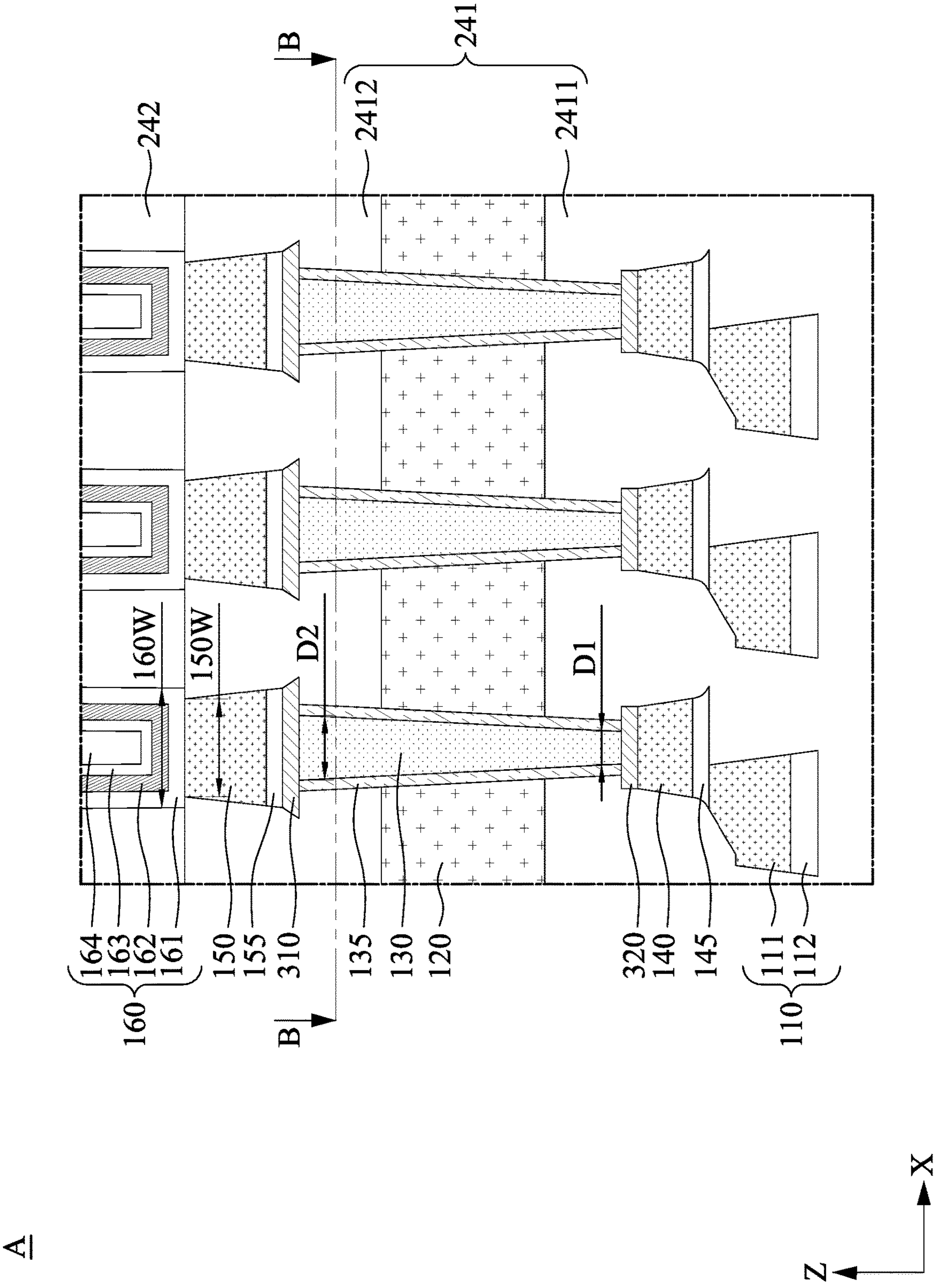
FIG. 1B is an enlarged perspective view of a region "A" in FIG. 1A.
Figure 1C:
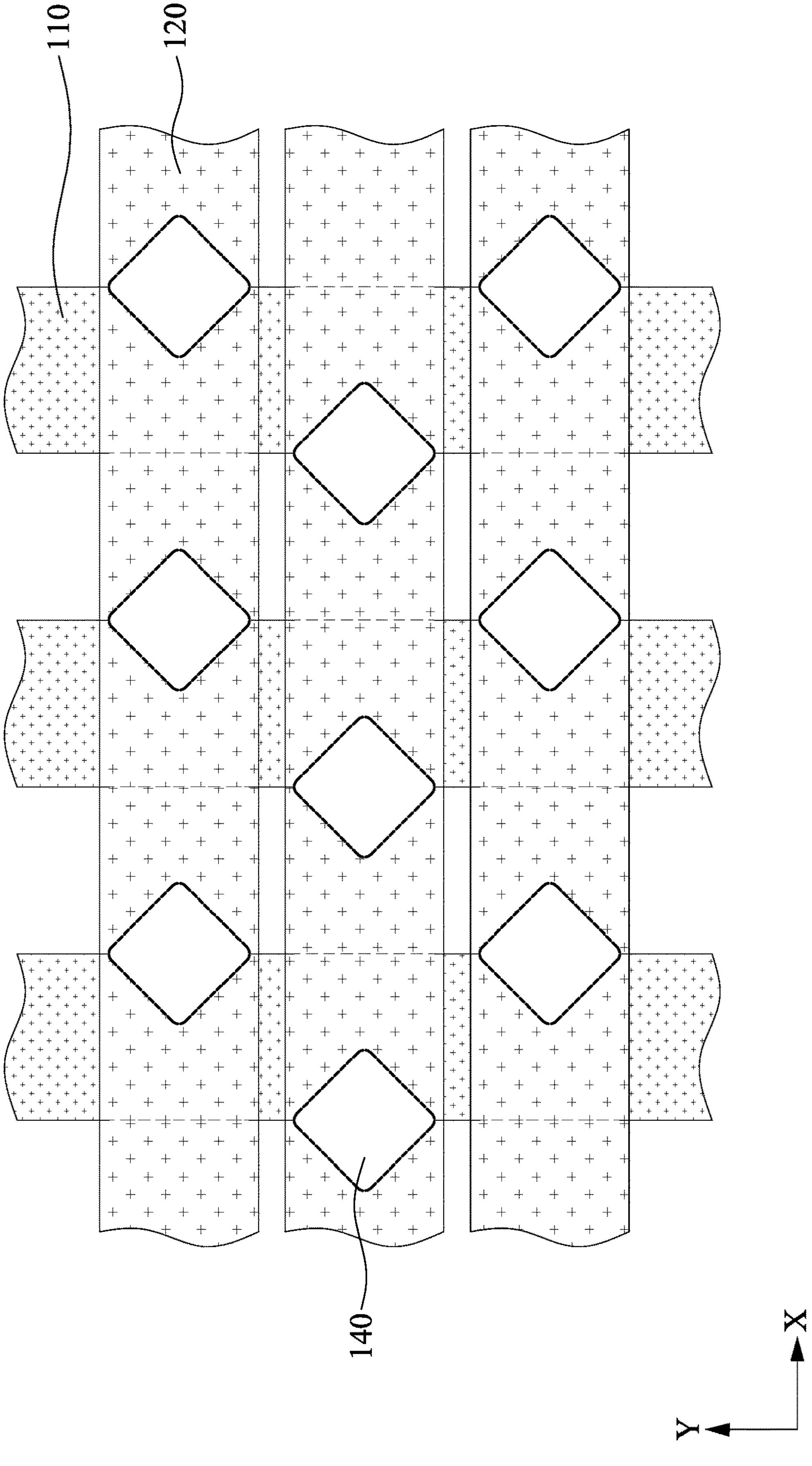
FIG. 1C is a top view of a semiconductor structure along the section line B-B of FIG. 1B.

The details of the array of transistors are discussed as follows in view of FIG. 1A, FIG. 1B and FIG. 1C. FIG. 1B is an enlarged perspective view of a region "A" in FIG. 1A. FIG. 1C is a top view of a semiconductor structure 1 along the section line B-B of FIG. 1B, from which the channel structure 130 and the gate dielectric layer 135 are omitted for clarity.

The semiconductor device 1 can include a plurality of bit lines 110 disposed on the substrate 210. The bit lines 110 can extend along the Y-axis, which is perpendicular to the X-axis and the Z axis. The bit lines 110 extend in parallel. In some embodiments, the number of the bit lines 110 can be 1, 2, 3, 4, 5, 6, 7, 8, 9, 10, 11, 12, 13, or more. The bit lines 110 can be electrically connected to the active areas of the substrate 220 (not shown).

The bit lines 110 can include conductive materials, such as tungsten, copper, aluminum, tantalum, tantalum nitride, titanium, titanium nitride, the like, and/or a combination thereof. Referring to FIG. 1B, for example, the bit lines 110 can include a titanium nitride layer 112 and a tungsten layer 111 disposed on the titanium nitride layer 112 opposite to the substrate 210. In some embodiments, the titanium nitride layer 112 can have a minimal thickness. For example, the thickness of the titanium nitride layer 112 can be less than that of the tungsten layer 111.

In some embodiments, the bit lines 110 can taper toward the channel structures 130. That is, the bit lines 110 can have an upper width less than the lower width thereof. For example, the width of the titanium nitride layer 112 can be greater than the width of the tungsten layer 111 of the bit lines 110.

During manufacture, after the titanium nitride layer 112 and the tungsten layer 111 are formed on the substrate 110, a removal operation can be conducted to form a plurality of bit lines 110 separated from each other. In some embodiments, the removal operation may be an etching process. With the removal operation, the bit lines 110 can have a structure with a top width less than bottom width.

Referring to FIG. 1B, the lower landing pads (LP) 140 are disposed on the bit lines 110. Each of the lower landing pads 140 can correspond to a respective one of the bit lines 110. In some embodiments, a respective one of the lower landing pads 140 can partially cover the respective one of the bit lines 110. That is, a projection of the lower landing pads 140 on the substrate 210 can partially overlap with the projection of the bit lines 110 on the substrate 210.

FIG. 1C is a top view of a semiconductor structure along the section line B-B of FIG. 1B. Referring to FIG. 1C, the lower landing pads 140 can form a quadrangle in the top view. In some embodiments, the lower landing pads 140 can be a parallelogram. For example, the lower landing pads 140 can be a rhombus. The lower landing pads 140 can be partially disposed on the bit lines 110, which extend along the Y-axis. For example, a half of the lower landing pads 140 can overlap the bit lines 110.

The lower landing pads 140 can include metal, such as W, Cu, Ru, Ir, Ni, Os, Rh, Al, Mo, Co, alloys thereof, combinations thereof or any metallic material with appropriate resistance and gap-fill capability. Preferably, the lower landing pads 140 can be made of tungsten (W) or alloy thereof.

Referring back to FIG. 1B, the lower landing pads 140 can contact the bit lines 110 through a titanium nitride layer 145. In some embodiments, each of the lower landing pads 140 can have the titanium nitride layer 145. In some embodiments, the titanium nitride layer 145 can have a minimal thickness. For example, the thickness of the titanium nitride layer 145 can be less than that of the lower landing pads 140.

In some embodiments, the lower landing pads 140 can taper toward the channel structures 130. That is, the lower landing pads 140 can have an upper width less than a lower width. For example, the width of the titanium nitride layer 145 can be greater than the width of the lower landing pads 140.

During manufacture, after the titanium nitride layer 145 and the lower landing pads 140 are formed on the bit lines 110, a removal operation can be conducted to form lower landing pads 140 separated from each other. With the removal operation, the lower landing pads 140 can have a structure with top width less than bottom width. In some embodiments, the removal operation of the lower landing pads 140 may be partially conducted on the bit lines 110. A portion of the bit lines 110 can be removed, such that a lateral surface of the lower landing pad 140 can smoothly continue the top surface of the bit line 110. In some embodiments, the bit lines 110 having this structure can have a greater distance from the adjacent lower landing pad 140 (for example, the left) so as to avoid short circuit therebetween.

Referring to FIG. 1B, the indium tin oxide (ITO) layer 320 can be disposed on the lower landing pads 140. In some embodiment, the ITO layer 320 can be disposed between the channel structures 130 and the lower landing pads 140. In some embodiments, the ITO layer 320 can have a minimal thickness. For example, the thickness of the ITO layer 320 can be less than that of the lower landing pads 140.

The dielectric layer 2411 can be disposed on the substrate 210 and cover the bit lines 110, the lower landing pads 140, and the ITO layer 320. In other words, the bit lines 110, the lower landing pads 140, and the ITO layer 320 can be surrounded by the dielectric layer 2411.

In some embodiments, the dielectric layer 2411 can include silicon oxide ($SiO_x$), silicon nitride ($Si_xN_y$), silicon oxynitride (SiON), phosphosilicate glass (PSG), borophosphosilicate glass (BPSG), a low-k dielectric material ($k<4$), or other appropriate materials.

The channel structures 130 can be disposed on the lower landing pads 140 through the ITO layer 320. In some embodiments, the channel structure 130 can be disposed on the bit lines 110 and electrically connected to the bit lines 110. In some embodiments, the channel structures 130 can penetrate the word line 120. Each of channel structures 130 can correspond to a respective one of the lower landing pads 140. In some embodiments, a respective one of the channel structures 130 can align with the respective one of the lower landing pads 140. That is, a projection of the channel structures 130 on the substrate 210 can overlap with the projection of the lower landing pads 140 on the substrate 210.

Each of the channel structures 130 can correspond to a respective one of the bit lines 110. In some embodiments, a respective one of the channel structures 130 can partially cover the respective one of the bit lines 110. That is, a projection of the channel structures 130 on the substrate 210 can partially overlap with the projection of the bit lines 110 on the substrate 210.

In some embodiments, the channel structure 130 can taper toward the bit lines 110. That is, the channel structures 130 tapers along the Z-axis away from the trench capacitor 160. The channel structure 130 can have an upper diameter D2 adjacent to the upper landing pads 150 greater than a lower diameter D1 adjacent to the lower landing pads 140. For example, the channel structure 130 can have an upper width (D2) greater than a lower width (D1).

The material of the channel structures 130 can include an amorphous semiconductor, a poly-semiconductor and/or metal oxide. The semiconductor can include, but is not limited to, germanium (Ge), silicon (Si), tin (Sn), antimony (Sb). The metal oxide may include, but is not limited to, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide, but the present disclosure is not limited in this regard.

Referring to FIG. 1B, the gate dielectric layer 135 can surround the channel structure 130. The gate dielectric layer 135 can be formed between the channel structure 130 and the word line 120. In some embodiments, the channel structures 130 can be separated from the word line 120 by the gate dielectric layer 135.

In some embodiments, the gate dielectric structure 135 can include silicon oxide ($SiO_x$), silicon nitride ($Si_xN_y$), silicon oxynitride (SiON), or a combination thereof. In some embodiments, the gate dielectric layer can include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other appropriate materials are within the contemplated scope of this disclosure.

The word line 120 can be disposed on the dielectric layer 2411. The word line 120 can extend along the X-axis. Referring to FIG. 1C, the word line 120 can extend in a direction perpendicular to the orientation (Y-axis) of the bit lines 110. The word line 120 can overlap the lower landing pads 140. That is, the word line 120 can overlap the channel structures 130 (not shown in FIG. 1C), which is aligned with the lower landing pads 140.

Referring to FIG. 1C, the arrangement of the lower landing pads 140 is hexagonal. Similarly, the trench capacitors 160 and channel structures 130, which disposed on the lower landing pads 140, are arranged hexagonally. The intersections of the word lines 120 and the bit lines 110 are orthogonal. The lower landing pads 140 can convert an orthogonal arrangement to a hexagonal arrangement. Thus, the trench capacitors 160 can be compactly arranged through a conversion of the lower landing pads 140.

Referring to FIG. 1B, the word line 120 can surround the channel structures 130. The word line 120 can cover a lateral surface of the channel structures 130. The word line 120 can contact the gate dielectric layer 135. In some embodiments, the semiconductor device 1 can include one or more word lines 120 (not shown).

In some embodiments, the etching process for manufacturing the channel structure 130 may be insufficiently deep. In this case, the bottom surface of the channel structure 130 can contact the word line 120, such that the channel structure 130 and the word line 120 are shorted. In current practice, since the bit line is disposed on the channel structure, a short circuit may occur between the bit line and the word line through the failed channel structure, and thus other channel structures connected to the same bit line would fail as well. The present disclosure provides a semiconductor device with the capacitor formed last (i.e., the capacitor disposed on the channel structure). In this case, a short circuit may occur between the word line 120 and the capacitor 160 through the failed channel structure, and thus only one memory cell (containing the failed channel structure) would be affected. Accordingly, yield of the semiconductor device can be improved.

Referring to FIG. 1A, the word line 120 can extend out of the array of the transistors. In some embodiments, the semiconductor device 1 can include a word line contact 125 disposed between the word line 120 and the conductive layer 230. The word line contact 125 can penetrate the dielectric layer 2411 and connect the word line 120 and the conductive layer 230. The word line contact 125 can be spaced apart from the channel structures 130.

The word line contact 125 can include metal, such as W, Cu, Ru, Ir, Ni, Os, Rh, Al, Mo, Co, alloys thereof, combinations thereof or any metallic material with appropriate resistance and gap-fill capability.

Referring to FIG. 1B, the upper landing pads 150 are disposed on the channel structures 130. Each of the upper landing pads 150 can correspond to a respective one of the channel structures 130. In some embodiments, a respective one of the upper landing pads 150 can align with the respective one of the channel structures 130. That is, a projection of the upper landing pads 150 on the substrate 210 can overlap with the projection of the channel structures 130 on the substrate 210.

In some embodiments, the upper landing pads 150 can align with the lower landing pads 140. In other words, the upper landing pads 150 can cover the lower landing pads 140. In some embodiments, the upper landing pads 150 can have a shape and/or material similar to the lower landing pads 140.

In some embodiments, the upper landing pads 150 can be of material similar to the lower landing pads 140.

In some embodiments, the upper landing pads 150 can be connected to the channel structures through a titanium nitride layer 155. Each of the upper landing pads 150 can have a titanium nitride layer 155. In some embodiments, the titanium nitride layer 155 can be similar to the titanium nitride layer 145.

In some embodiments, the upper landing pads 150 can taper away from the channel structures 130. The upper landing pads 150 can taper toward the trench capacitor 160. That is, the upper landing pads 150 can have an upper width less than a lower width. For example, the width of the titanium nitride layer 155 can be greater than the width of the upper landing pads 150.

During manufacture, after the titanium nitride layer 155 and the upper landing pads 150 are formed, a removal operation can be conducted to form upper landing pads 150 separated from each other. With the removal operation, the upper landing pads 150 can have a structure with top width less than bottom width.

Referring to FIG. 1B, the indium tin oxide (ITO) layer 310 can be disposed on the channel structures 130. In some embodiment, the ITO layer 310 can be disposed between the channel structures 130 and the upper landing pads 150. In some embodiments, the ITO layer 320 can be similar to the ITO layer 310.

In some embodiments, the ITO layers 310 and 320 can be a source/drain. The channel structures 130 can connect the ITO layer 310 to the ITO layer 320, and be configured to turn on and off in response to the signal (for example, voltage or current) transmitted from the word line 120 through the gate dielectric layer 135.

The dielectric layer 2412 can be disposed on the word line 120 and cover the upper landing pads 150, the ITO layer 310, and the channel structures 130. In other words, the upper landing pads 150, the ITO layer 310, and the channel structures 130 can be surrounded by the dielectric layer 2412. In some embodiments, the channel structure 130 can penetrate the dielectric layers 2411 and 2412 and the word line 120. In some embodiments, the dielectric layer 2412 can be identical or similar to the dielectric layer 2411. The dielectric layers 2411 and 2412 can be formed in different manufacturing steps.

The dielectric layers 2411 and 2412 can form the dielectric layer 241 (as shown in FIG. 1A). That is, the dielectric layer 241 can surround the array of transistors and the word line contact 125.

Referring to FIG. 1A, the dielectric layers 242, 243, 244, and 245 can be disposed on the dielectric layer 241. The dielectric layers 242, 243, 244, and 245 can be disposed on the array of transistors. The dielectric layers 242, 243, 244, and 245 can be formed in different manufacturing steps or in one step. In some embodiments, the dielectric layers 242, 243, 244, and 245 can be of the same or similar material. In another embodiment, the dielectric layers 242, 243, 244, and 245 can be of the same material at different concentrations. The dielectric layers 242, 243, 244, and 245 can be of material similar to that of the dielectric layer 241.

The trench capacitors 160 can be disposed on the channel structures 130. In some embodiments, the trench capacitors 160 can penetrate the dielectric layers 242, 243, 244, and 245 and connect to the channel structures 130. The trench capacitors 160 can taper toward the channel structures 130. In some embodiments, the trench capacitors 160 can be electrically connected to the channel structures 130 through the upper landing pads 150 and the ITO layer 310. In some embodiments, the upper width 150 W of the upper landing pads 150 can be equal to or less than the lower width 160 W of the trench capacitors 160 adjacent to the upper landing pads 150.

Each of the trench capacitors 160 can correspond to a respective one of the channel structures 130 of the array of transistors. That is, the trench capacitors 160 are arranged in an array. In some embodiments, each of the trench capacitor 160 can be referred to as a capacitor cell.

Referring to FIG. 1B, the trench capacitors 160 can include a multilayered stack (including conductive layers 161 and 163 and the dielectric layer 162) and a contact material 164. During manufacture of the trench capacitors 160, the dielectric layers 242, 243, 244, and 245 can be removed to form a plurality of trenches. The multilayered stack can be formed within the trenches, and then the contact material 164 can be filled in the trench.

The conductive layer 161 can be disposed on the dielectric layer 245 (see FIG. 1A). The conductive layer 161 can be disposed within the trenches. The conductive layer 161 can cover a lateral surface of the dielectric layers 242, 243, 244, and 245. A portion of the conductive layer 161 can be disposed on the upper landing pads 150. The conductive layer 161 may have an underside coplanar with the top surface of the upper landing pads 150. In some embodiments, the conductive layer 161 can contact the upper landing pads 150.

The dielectric layer 162 can be disposed on the conductive layer 161. In some embodiments, the dielectric layer 162 can be disposed on the dielectric layer 245 (see FIG. 1A). The dielectric layer 162 can be disposed within the trenches. The dielectric layer 162 can cover a lateral surface of the dielectric layers 242, 243, 244, and 245. A portion of the dielectric layer 162 can be disposed on the upper landing pads 150. In some embodiment, the underside of the dielectric layer 162 can be coplanar with the top surface of the conductive layer 161.

In some embodiments, the conductive layer 163 can be disposed on the dielectric layer 162. The conductive layer 163 can be disposed on the dielectric layer 245 (see FIG. 1A). The conductive layer 163 can be disposed within the trenches. The conductive layer 163 can cover a lateral surface of the dielectric layers 242, 243, 244, and 245. A portion of the conductive layer 163 can be disposed on the upper landing pads 150. In some embodiment, the underside of the conductive layer 163 can be coplanar with the top surface of the dielectric layer 162.

In some embodiments, the multilayered stack of the trench capacitor 160 can include more conductive layers and dielectric layers. The embodiment shown in FIG. 1B includes two conductive layers 161 and 163 and one dielectric layer 162, for example, but is not limited thereto.

In some embodiments, the conductive layers 161 and 163 and the dielectric layer 162 can have the same thickness. In another embodiment, the thickness of the conductive layers 161 and 163 and the dielectric layer 162 can be different. The thickness of the conductive layer 161 can equal or exceed that of the dielectric layer 162. The thickness of the dielectric layer 162 can equal or exceed that of the conductive layer 163.

In some embodiments, the conductive layers 161 and 163 can be of the same material. For example, the material of the conductive layers 161 and 163 can include titanium nitride (TiN). In some embodiments, the dielectric layer 162 may be of a high-k dielectric material. For example, the dielectric layer 162 can include zirconium oxide ($ZrO_2$), titanium oxide ($TiO_2$), or the combination thereof.

Referring to FIG. 1A and FIG. 1B, the contact material 164 of the trench capacitor 160 can be disposed on the multilayered stack (including conductive layers 161 and 163 and the dielectric layer 162). In some embodiments, the contact material 164 can be disposed within the trench defined by the multilayered stack. The contact material 164 can cover a lateral surface of the conductive layer 163. In some embodiments, the contact material 164 can be of semiconductor material. For example, the contact material 164 can be of polysilicon. In some embodiments, the contact material 164 of the trench capacitor 160 can be configured to receive electrical voltage.

Referring to FIG. 1A, the contact material 164 can form a contact layer 164*a* disposed on the dielectric layer 245. The contact layer 164*a* can be disposed on the trench capacitors 160, opposite to the channel structures 130. In some embodiments, the contact layer 164*a* can include a sidewall 164*s*. The sidewall 164*s* can be non-planar. In some embodiments, the sidewall 164*s* can be curved.

In some embodiments, the conductive layer 180 can be disposed on the contact layer 164*a*. In some embodiments, the underside of the conductive layer 180 can be coplanar with the top surface of the contact layer 164*a*. The conductive layer 180 can have a width greater than that of the contact layer 164*a*. The conductive layer 180 can have a sidewall 180*s*. The sidewall 164*s* of the contact layer 164*a* can be recessed from the sidewall 180*s* of the conductive layer 180. In some embodiments, the conductive layer 180 and the contact material 164*a* can be configured to receive electrical voltage (not shown).

The conductive layer 180 can include metal, such as W, Cu, Ru, Ir, Ni, Os, Rh, Al, Mo, Co, alloys thereof, combinations thereof or any metallic material with appropriate resistance and gap-fill capability.

The dielectric layer 248 can be disposed on the conductive layer 180. The dielectric layer 248 can have a width identical to that of the conductive layer 180. In some embodiments, the dielectric layer 248 can have a sidewall 248*s*. The sidewall 248*s* of the dielectric layer 248 can be coplanar with the sidewall 180*s*. In some embodiments, the dielectric layer 248 can be of material similar to the dielectric layer 241.

In some embodiments, the contact layer 164*a*, the conductive layer 180, and the dielectric layer 248 can be referred to as a top cell plate (TCP). In some embodiments, after the contact layer 164*a*, the conductive layer 180, and the dielectric layer 248 are formed on the dielectric layer 245, a removal operation can be conducted thereon, such that a periphery region (the region apart from the trench capacitors 160) of the contact layer 164*a*, the conductive layer 180, and the dielectric layer 248 can be removed (the right side in FIG. 1A).

The dielectric layer 246 can be disposed on the dielectric layer 245. The dielectric layer 246 can be disposed on the conductive layer 180. The dielectric layer 246 can cover the conductive layer 180 and the contact layer 164*a*. That is, lateral surfaces of the conductive layer 180 and the contact layer 164*a* can be covered by the dielectric layer 246. In some embodiments, the dielectric layer 246 can be of material similar to the dielectric layer 248 (i.e., similar to the dielectric layer 241).

The dielectric layer 247 can be disposed on the dielectric layer 246. In some embodiments, the dielectric layer 247 can be of material similar to the dielectric layer 241. In some embodiment, the dielectric layers 241, 242, 243, 244, 245, 246, 247, and 248 can be of the same material at different concentrations.

Referring to FIG. 1A, the contact 250 can be disposed on and electrically connected to the conductive layer 230. In some embodiments, the contact 250 can penetrate the dielectric layers 241, 242, 243, 244, 245, 246, and 247. The contact 250 is spaced apart from the channel structures 130. In some embodiments, the contact 250 can be is a monolithic structure.

The contact 250 can be electrically connected to the word line contact 125 through the conductive layers 220 and 230. The word line 120 is electrically connected to the contact 250 through the word line contact 125 and the conductive layers 220 and 230. The contact 250 can connect the conductive layer 230 to an upper conductive layer (not shown) for electric connection.

In this present disclosure, as the array of transistors (or word line) is close to the lower conductive layers (for example, the conductive layers 220 and 230), the resistance of the connection can be reduced due to short electrical path (shorter word line contact 125).

In old practice, the contact connecting the memory array to other elements is manufactured by stacking several contacts and stages. A defect called "missed contact" may happen if one or more of the contacts and stages are misaligned during the manufacturing. The "missed contact" may jeopardize the functions of the semiconductor device. On the other hand, the subject disclosure provides the contact 250, which is a monolithic structure, for connecting the memory array to other elements, and thus the missed contact can be avoided.

Figure 2A:
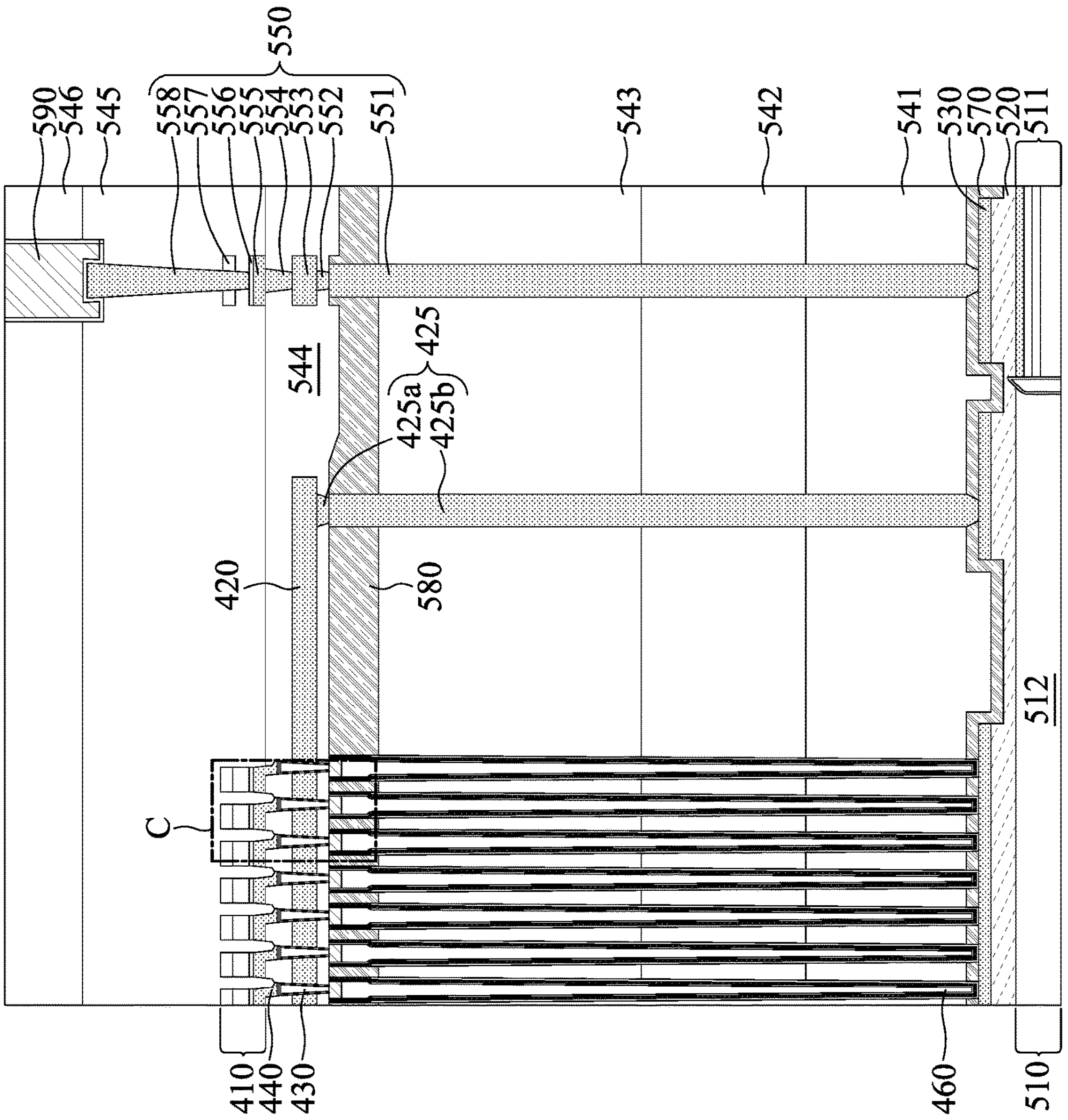
FIG. 2A is a cross-section of a semiconductor device, in accordance with some comparative embodiments of the present disclosure.

FIG. 2A is a cross-section of a semiconductor device 2, in accordance with some comparative embodiments of the present disclosure. In some embodiments, the semiconductor device 2 can firstly manufactures the capacitor.

The semiconductor device 2 includes a substrate 510, conductive layers 520 and 530, dielectric layers 541, 542, 543, 544, 545, and 546, bit lines 410, a word line 420, a word line contact 425, channel structures 430, landing pads 440, trench capacitors 460, a contact 550, and nitride layers 570 and 580.

Referring to FIG. 2A, the substrate 510 can be provided. The substrate 510 can be similar to the substrate 210, and thus the detailed description thereof is omitted. In some embodiments, the substrate 510 can include a plurality of active areas (not shown). The active area can function as, for example, a channel for electrical connection.

The substrate 510 can include a conductive stack 511 for connecting to the active areas of the substrate 510. In some embodiments, the substrate 510 can include an isolation structure 512. In some embodiments, the plurality of active areas can be separated by the isolation structures 512.

The conductive layer 520 can be disposed on the substrate 510. In some embodiments, the conductive layer 520 can have different thickness. The conductive layer 520 can be a patterned circuit layer. In some embodiments, the conductive layer 520 can be disposed on the isolation structure 512 and the conductive stack 511 of the substrate 510. In some embodiments, the conductive layer 520 can be electrically connected to the active areas of the substrate 510 (not shown). The conductive layer 520 can be similar to the conductive layer 220, and thus the detailed description thereof is omitted.

The conductive layer 530 can be disposed on the conductive layer 520. The conductive layer 530 can be similar to the conductive layer 230, and thus the detailed description thereof is omitted.

The nitride layer 570 can be disposed on the conductive layer 530. In some embodiments, the nitride layer 570 can be conformal with the conductive layers 520 and 530. That is, the nitride layer 570 can cover the top surfaces of the conductive layers 520 and 530. In some embodiments, the material of the nitride layer 570 can include silicon nitride (SiN).

In some embodiments, the dielectric layers 541, 542, and 543 can be disposed on the nitride layer 570. In some embodiments, the dielectric layer 541 can be disposed on the nitride layer 570. The dielectric layer 542 can be disposed on the dielectric layer 541. The dielectric layer 543 can be disposed on the dielectric layer 542.

The dielectric layers 541, 542, and 543 can be formed in different manufacturing steps or in one step. In some embodiments, the dielectric layers 541, 542, and 543 can have the same or similar material. In another embodiment, the dielectric layers 541, 542, and 543 can include the same material with different concentrations. The dielectric layers 541, 542, and 543 can be similar to that of the dielectric layer 241, and thus the detailed description is omitted.

The nitride layer 580 is disposed on the dielectric layer 543. The nitride layer 580 can have an uneven top surface. For example, the nitride layer 580 can have a greater thickness at the left side (the array of the transistors) and a thinner thickness at the right side (the periphery region).

The trench capacitors 460 can be disposed on the substrate 510. The trench capacitors 460 can penetrate the nitride layer 580, the dielectric layers 541, 542, and 543, and the nitride layer 570. In some embodiments, the trench capacitors 460 can contact the conductive layer 530.

Figure 2B:
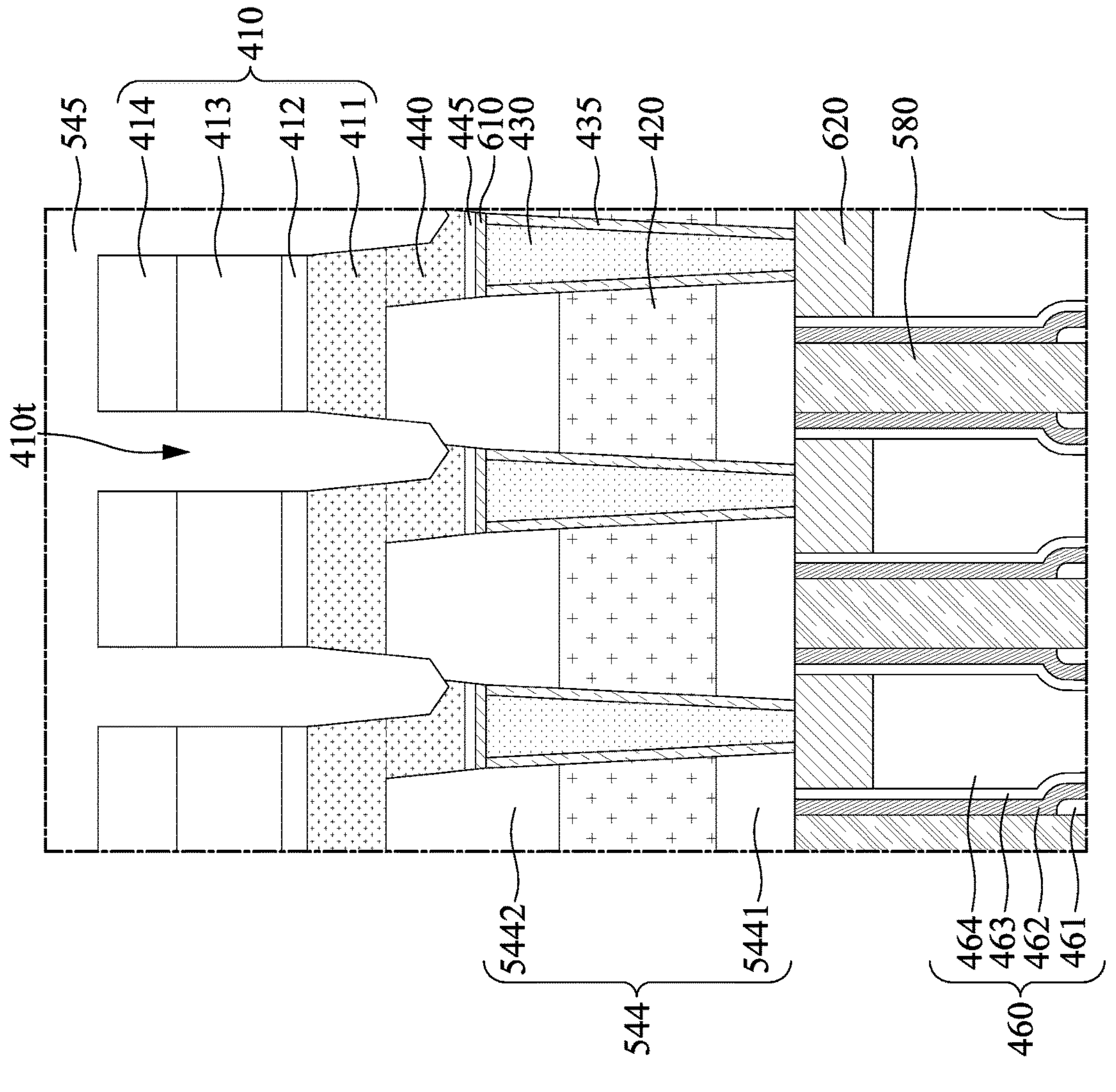
FIG. 2B is an enlarged perspective view of a region "C" in FIG. 2A.

The details of the trench capacitors 460 are discussed below in view of FIG. 2A and FIG. 2B. FIG. 2B is an enlarged perspective view of a region "C" in FIG. 2A.

Referring to FIG. 2B, the trench capacitor 460 can include a multilayered stack (including conductive layers 461 and 463 and the dielectric layer 462) and a contact material 464. During the manufacturing of the trench capacitors 460, the nitride layer 580, the dielectric layers 541, 542, and 543, and the nitride layer 570 can be removed to form a plurality of trenches. The multilayered stack can be formed within the trenches, and then the contact material 464 can be filled in the trench defined by the multilayered stack.

The conductive layers 461 and 463, the dielectric layer 462, and a contact material 464 can be similar to the conductive layers 161 and 163, the dielectric layer 162, and a contact material 164, respectively, and thus the detailed descriptions thereof are omitted.

In some embodiments, an ITO layer 620 can be disposed on the contact material 464. In some embodiments, the ITO layer 620 can be filled in the trenches defined by the multilayered stack and in contact with the contact material 464. In some embodiments, the top surface of the ITO layer 620 can be coplanar with the top surface of the nitride layer 580.

Referring to FIG. 2A, the semiconductor device 2 can include an array of transistors (for example, the region "C") disposed on the substrate 510. The array of transistors can include the bit lines 410, landing pads 440, channel structures 430, and word line 420. The details of the array of transistors are discussed below in view of FIG. 2A and FIG. 2B.

A dielectric layer 5441 can be disposed on the trench capacitors 460. The dielectric layer 5441 can be similar to the dielectric layer 2441, and thus the detailed description thereof is omitted.

The word line 420 can be disposed above the trench capacitors 460. In some embodiments, the word line 420 can be disposed on the dielectric layer 5441. The word line 420 can be similar to the word line 120, and thus the detailed description thereof is omitted.

A dielectric layer 5442 can be disposed on the word line 420. In some embodiments, the word line 420 can be disposed between the dielectric layers 5441 and 5442. The dielectric layer 5442 can be similar to the dielectric layer 2442, and thus the detailed description thereof is omitted.

The channel structures 430 can disposed on the trench capacitors 460. In some embodiments, the channel structures 430 can be disposed on the ITO layer 620. In some embodiments, the channel structures 430 can taper toward the trench capacitors 460. A respective one of the channel structures 430 can correspond to a respective one of the trench capacitors 460. The channel structures 430 can separate from the word line 420 by a gate dielectric layer 435. The channel structures 430 can be similar to the channel structures 130, and thus the detailed description thereof is omitted. The gate dielectric layer 435 can be similar to the gate dielectric layer 135, and thus the detailed description thereof is omitted.

Referring to FIG. 2B, an ITO layer 610 can be disposed on the channel structures 430. In some embodiments, the ITO layer 610 can be thinner than the ITO layer 620.

In some embodiments, the landing pads 440 can be disposed on the ITO layer 610. The landing pads 440 can contact the ITO layer 610 (or the channel structures 430) through a titanium nitride layer 445.

In some embodiments, the landing pads 440 can taper toward the channel structures 430. That is, the landing pads 440 can have an upper width less than a lower width. For example, the width of the titanium nitride layer 445 can be less than the width of the landing pads 440.

The bit lines 410 can be disposed on the landing pads 440. In some embodiments, the bit lines 410 can be connected to the channel structures 430 through the landing pads 440.

Referring to FIG. 2B, the bit lines 410 can include a multilayered stack (including layers 411, 412, 413, and 414). The conductive layer 411 can be disposed on the dielectric layer 5442. The conductive layer 412 can be disposed on the conductive layer 411. In some embodiments, the dielectric layer 413 can be disposed on the conductive layer 412. The conductive layer 414 can be disposed on the dielectric layer 413.

The conductive layers 411, 412, and 414 can include metal, such as W, Cu, Ru, Ir, Ni, Os, Rh, Al, Mo, Co, alloys thereof, combinations thereof or any metallic material with appropriate resistance and gap-fill capability. For example, the conductive layer 411 can include tungsten, the conductive layer 412 can include titanium nitride, and the conductive layer 414 can include copper. In some embodiment, the dielectric layer 413 can include a material similar to that of the dielectric layer 544.

After the multilayered stack of the bit line 410 is formed, a removing operation can be conducted, such that a plurality of openings 410*t* can be formed. The openings 410*t* can separate each bit line 410. In some embodiments, the openings 410*t* can remove a portion of the landing pads 440, such that the landing pads 440 can be separated from the bit lines 410.

The dielectric layer 545 can be disposed on the bit lines 410 and filled in the openings 410*t*. In some embodiments, the dielectric layer 545 can include a material similar to that of the dielectric layer 413.

The distance of the landing pads 440 and the adjacent conductive layer 411 of the bit lines 410 may be small, and thus a short circuit may occur between the landing pad 440 and the adjacent bit line 410. Accordingly, the present disclosure shown in FIG. 1A can avoid this problem.

Referring back to FIG. 2A, the word line 420 can extend out of the array of the transistors. In some embodiments, the semiconductor device 2 can include a word line contact 425 disposed between the word line 420 and the conductive layer 430. In some embodiments, the word line contact 425 can include two portions 425*a* and 425*b*.

The portion 425*b* of the word line contact 425 can penetrate the nitride layer 580, the dielectric layers 541, 542, and 53, and the nitride layer 570. In some embodiments, the portion 425*b* can be disposed on the conductive layer 530.

The portion 425*a* of the word line contact 425 can penetrate the dielectric layer 541 and disposed on the portion 425*b*. Accordingly, the word line 425 can connect the word line 420 and the conductive layer 530. The word line contact 425 can be spaced apart from the channel structures 430.

Referring to FIG. 2A, a contact 550 can be disposed on and electrically connected to the conductive layer 530. In some embodiments, the contact 550 can penetrate the dielectric layers 541, 542, 543, 544, and 545, and the nitride layers 570 and 580. The contact 550 is spaced apart from the channel structures 430.

In some embodiments, the contact 550 can include a stack structure. The contact 550 can include pillars 551, 552, 554, and 556, and stages 553, 555, and 557.

The pillar 551 can penetrate the nitride layer 580, the dielectric layers 541, 542, and 543, and the nitride layer 570. In some embodiments, the pillar 551 can be disposed on the conductive layer 530. In some embodiments, the pillar 551 can be formed with the portion 425*b* of the word line contact 425 at the same process.

The pillar 552 can be disposed on the pillar 551. The size of the pillar 552 can be less than that of the pillar 551. For example, the diameter of the pillar 552 can be less than that of the pillar 551. In some embodiments, the pillar 552 can be formed with the portion 425*a* of the word line contact 425 at the same process.

The stage 553 can be disposed on the pillar 552. In some embodiments, the stage 553 can be disposed within the dielectric layer 544. The stage 553 can be aligned with the word line 420 horizontally. In some embodiments, the stage 553 can be formed with the word line 420 at the same process.

The pillar 554 can be disposed on the stage 553. In some embodiments, the pillar 554 can be disposed within the dielectric layer 544. The pillar 554 can have a top surface aligned with the top surface of the landing pads 440.

The stage 555 can be disposed on the pillar 554. In some embodiments, the stage 555 can be disposed within the dielectric layer 545. The stage 555 can be aligned with the conductive layer 411 of the bit line 410 horizontally. In some embodiments, the stage 555 can be formed with the conductive layer 411 of the bit line 410 at the same process.

The stage 556 can be disposed on the stage 555. In some embodiments, the stage 556 can be disposed within the dielectric layer 545. The stage 556 can be aligned with the conductive layer 412 of the bit line 410 horizontally. In some embodiments, the stage 556 can be formed with the conductive layer 412 of the bit line 410 at the same process.

The stage 557 can be disposed on the stage 556. In some embodiments, the stage 557 can be disposed within the dielectric layer 545. The stage 557 can be aligned with the nitride layer 414 of the bit line 410 horizontally. In some embodiments, the stage 557 can be formed with the nitride layer 414 of the bit line 410 at the same process.

The pillar 558 can penetrate the stages 556 and 557 and disposed on the stage 555. The pillar 558 can be connected to the conductive layer 530 through the stage 556, pillar 554, stage 553, pillars 552 and 551.

An upper conductive layer 590 (referred to as MI layer) can be disposed within the dielectric layer 546. The upper conductive layer 590 can be disposed on the pillar 558 of the contact 550. The upper conductive layer 590 can have a recess at the bottom surface for accommodating the pillar 558. In other words, the pillar 558 can be partially covered by the upper conductive layer 590.

In some embodiments, the contact 550 can electrically connect the conductive layer 520 and the upper conductive layer 590. The upper conductive layer 590 can provide electrical connection to other elements (for example, the external elements). In some embodiments, the word line 420 can electrically connected to the upper conductive layer 590 through the word line 425, the conductive layers 520 and 530, and the contact 550.

FIG. 3A, FIG. 3B, FIG. 3C, FIG. 3D, FIG. 3E, FIG. 3F, FIG. 3G, and FIG. 3H illustrate one or more operations of a method for manufacturing a semiconductor device, in accordance with some comparative embodiments of the present disclosure.

Referring to FIG. 3A, a substrate 210 is provided, and a conductive layer 220 can be formed on the substrate 210. In some embodiments, the substrate 210 may be in a wafer level or panel level. The substrate 210 can include active areas 211 and an isolation structure 212 disposed within the active areas 211. In some embodiments, the active areas 211 can be separated by the isolation structures 212. In some embodiments, the conductive layer 220 can be disposed on and connected to the active areas 211 of the substrate 210. The conductive layer 220 can be a patterned circuit layer.

Figure 3B:
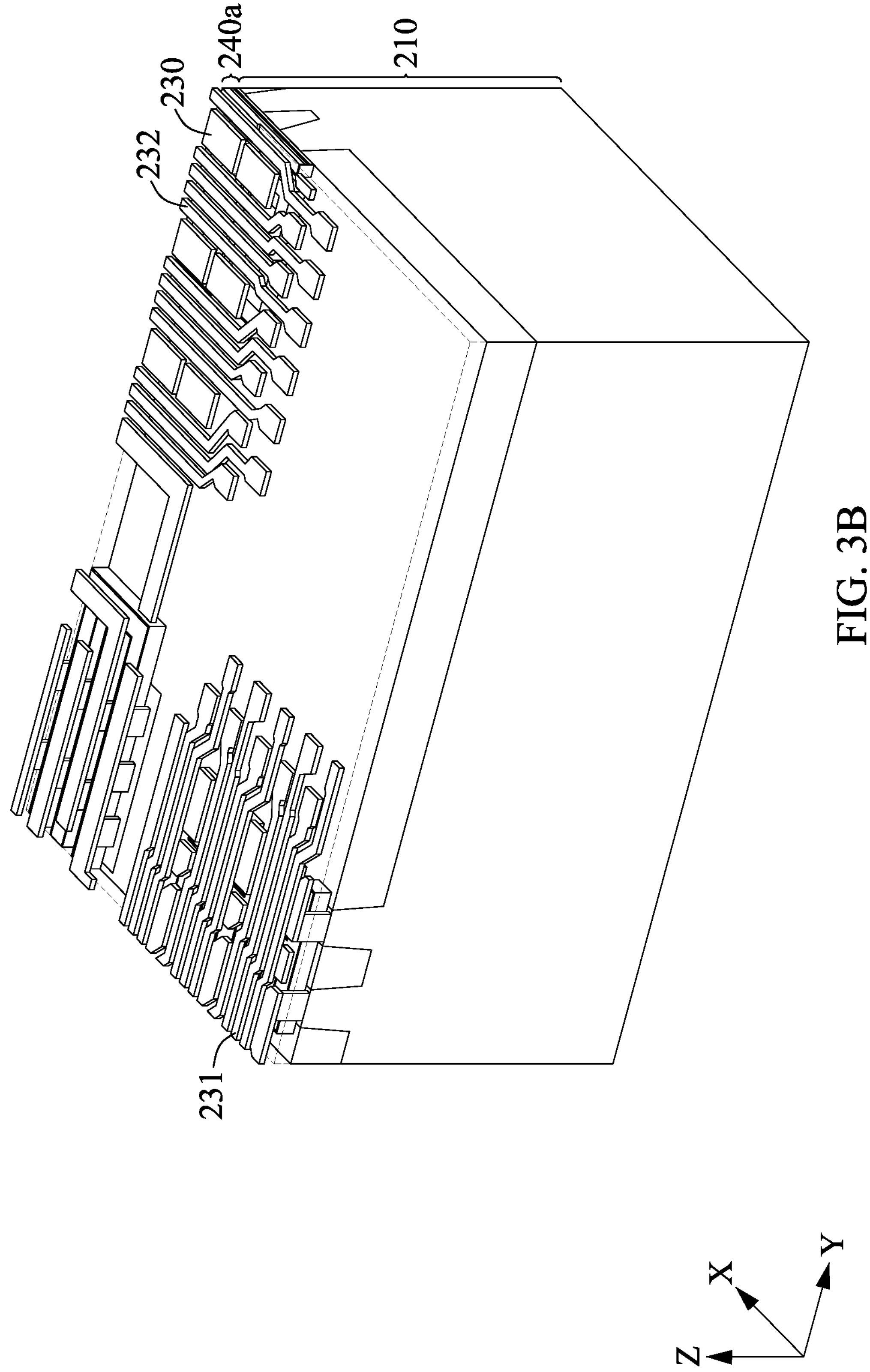

Referring to FIG. 3B, a dielectric layer 240*a* can be formed on the substrate 210, and a conductive layer 230 can be formed on and electrically connected to the conductive layer 220. The conductive layer 230 can include bit line conductive segments 231 and word line conductive segments 232. In some embodiments, the orientation of the bit line conductive segments 231 can be substantially perpendicular to that of the word line conductive segments 232.

Referring to FIG. 3C, a plurality of bit line contact 115 are formed on the bit line conductive segments 231. In some embodiments, each bit line conductive segment 231 can have one or more bit line contacts 115 disposed thereon. In some embodiments, the bit line contact 115 can be similar to the word line 125 as discussed previously.

Figure 3D:
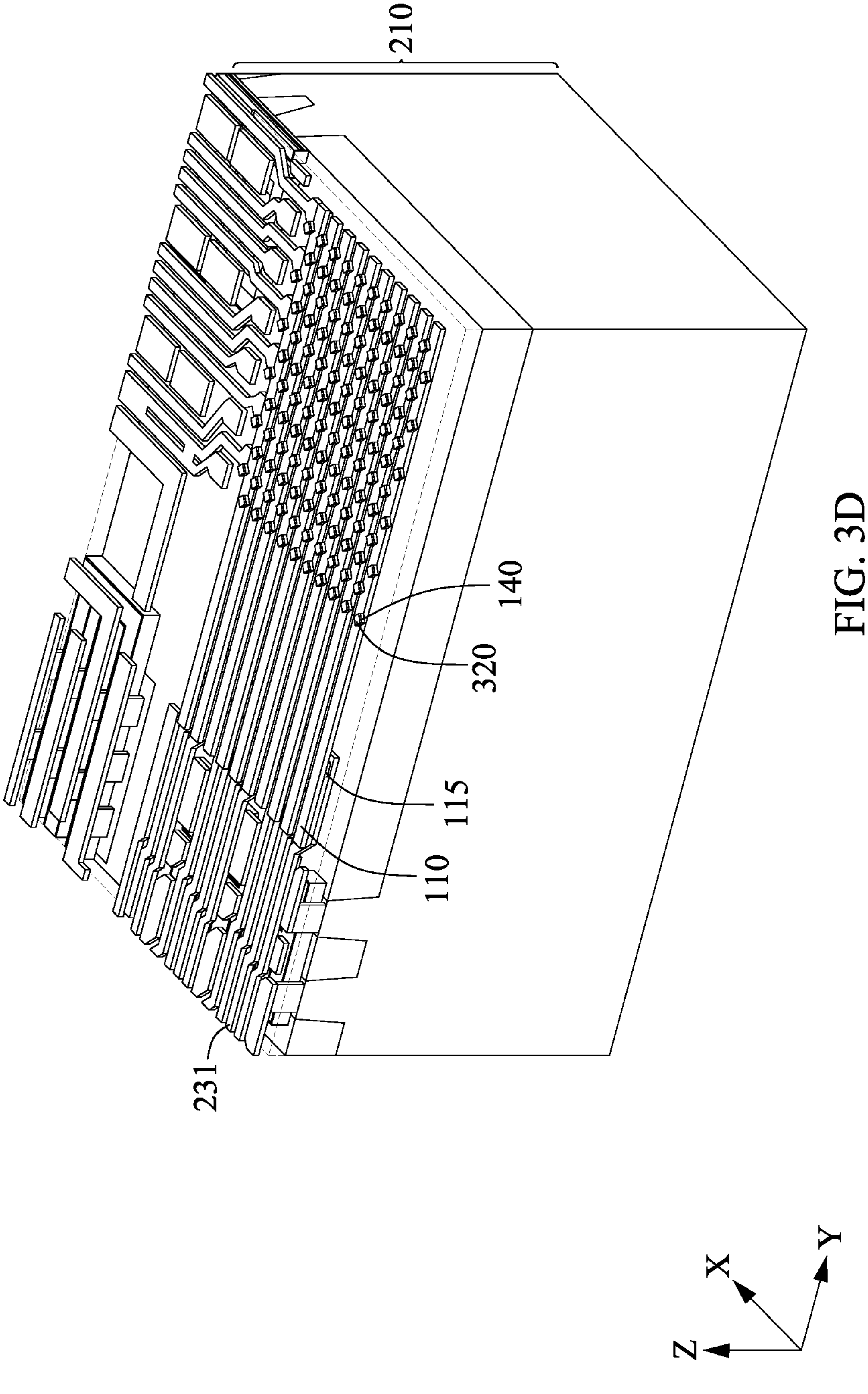

Referring to FIG. 3D, a plurality of bit lines 110 are formed on the substrate 210; a plurality of lower landing pads 140 are formed on the bit lines 110; and a indium tin oxide (ITO) layer 320 is formed on a respective one of the lower landing pads 140. In some embodiments, the bit lines 110 are connected to the bit line conductive segments 231 through the bit line contacts 115. The bit lines 110 can extend along the Y-axis. In some embodiments, each bit line 110 can include several lower landing pads 140 disposed thereon. As shown in FIG. 1C, each lower landing pad 140 has a half portion covering the bit line 110.

Referring to FIG. 3E, a plurality of word line contacts 125 are formed on the word line conductive segments 232. In some embodiments, each word line conductive segment 232 can have one or more word line contacts 125 disposed thereon.

Figure 3F:
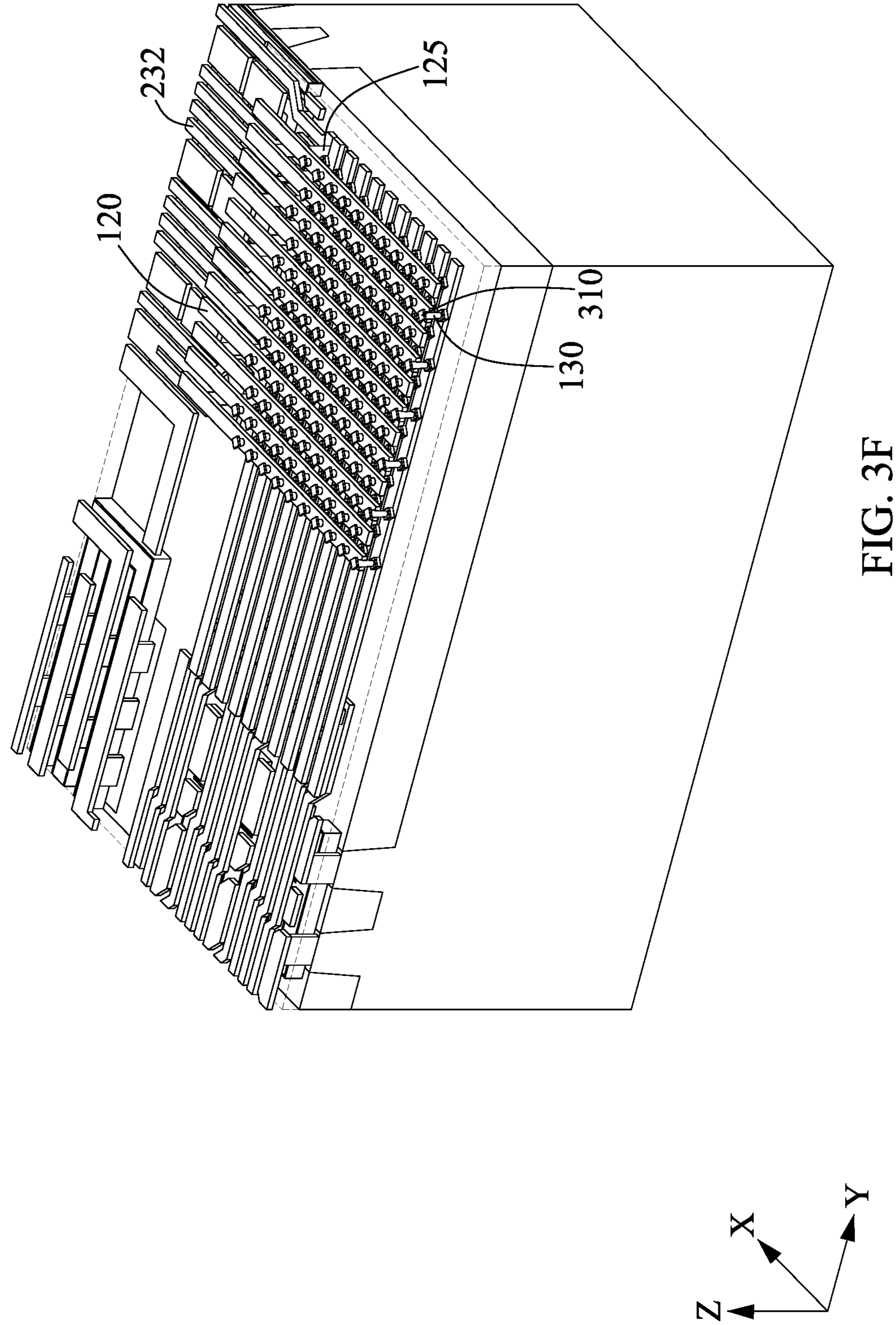

Referring to FIG. 3F, a plurality of word lines 120 are formed above the bit lines 110, a plurality of channel structures 130 are formed on the bit lines 110, and a indium tin oxide (ITO) layer 310 is formed on a respective one of the channel structures 130. In some embodiments, the word lines 120 are connected to the word line conductive segments 232 through the word line contacts 125. The word lines 120 can extend along the X-axis. In some embodiments, each word line 120 can be penetrated by several channel structures 130. The channel structures 130 can be formed on the lower landing pads 140. In some embodiments, each channel structure 130 can correspond to one lower landing pad 140. In some embodiments, the channel structure 130 can have a gate dielectric layer 135 (not shown) formed between the word line 120 and the channel structure 130.

Referring to FIG. 3G, a plurality of upper landing pads 150 are formed on the channel structures 130. In some embodiments, the upper landing pads 150 can be connected to the channel structure through the ITO layer 310.

Figure 3H:
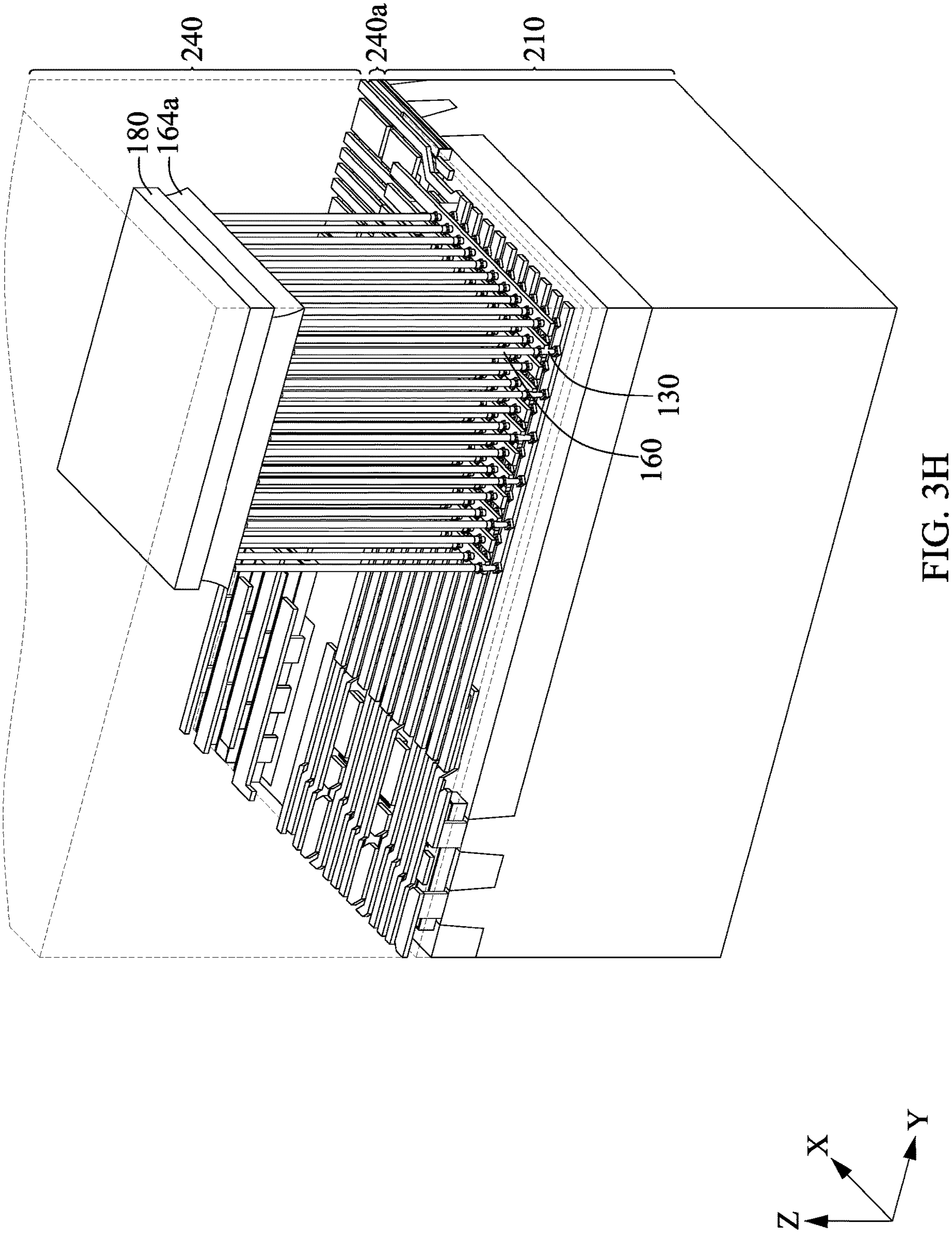

Referring to FIG. 3H, a plurality of trench capacitors 160 are formed on the channel structures 130, a contact layer 164*a* and a conductive layer 180 are formed on the trench capacitors 160, and a dielectric layer 240 is formed on the dielectric layer 240*a*. In some embodiments, a respective one of the trench capacitors 160 can correspond to a respective one of the channel structures 130. The dielectric layer 240 can cover elements above the dielectric layer 240*a*, for example, the channel structures 130, the trench capacitors 160, the contact layer 164*a*, and the conductive layer 180. In some embodiments, the dielectric layers 240*a* and 240 may be formed in several steps (such as the dielectric layers 241, 242, 243, 244, 245, 246, 247, and 248 shown in FIG. 1A). Then, a semiconductor device 1 as described and illustrated with reference to FIG. 1A is formed.

Figure 4:
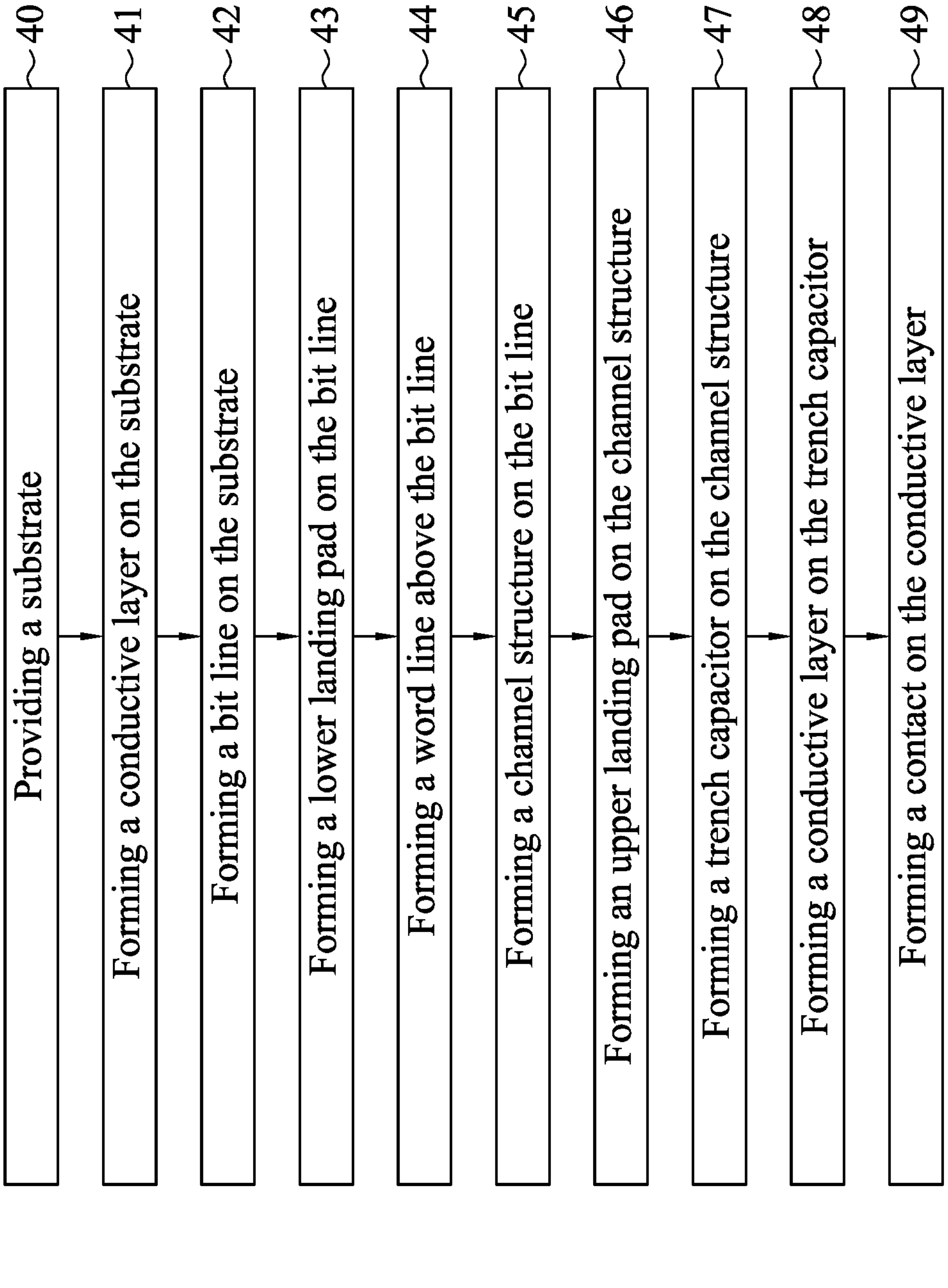
FIG. 4 is a flowchart of a method for manufacturing a semiconductor device, in accordance with some embodiments of the present disclosure.

FIG. 4 is a flowchart of a method for manufacturing a semiconductor device, in accordance with some embodiments of the present disclosure. In some embodiments, this method can be conducted to manufacture the semiconductor device 1 in FIG. 1A.

In operation 40, a substrate is provided. For example, the substrate 210 of FIG. 1A can be provided in operation 40.

In operation 41, a conductive layer (for example, the conductive layers 220 and/or 230) is formed on the substrate 210.

In operation 42, a bit line 110 is formed on the substrate 210. The bit line 110 extends along a first orientation (Y-axis). In some embodiments, the conductive layers 220 and 230 can be disposed between the substrate 210 can the bit line 110.

In operation 43, a lower landing pad is formed on the bit line. For example, referring to FIG. 1A, a lower landing pad 140 is formed on the bit line 110 in operation 43.

In operation 44, a word line 120 is formed above the bit line 110. The word line 120 extends along a second orientation (X-axis) perpendicular to the first orientation. The word line 120 is formed on the first dielectric layer 2411. That is, the first dielectric layer 2411 is formed between the bit line 110 and the word line 120. In some embodiments, a second dielectric layer 2412 is formed on the word line 120. In other words, the first dielectric layers 2411 and 2412 can be formed on the opposite sides of the word line 120.

In operation 45, a channel structure 130 is formed on the bit line 110. The channel structure 130 penetrates the word line 120 and is formed on the lower landing pad 140. That is, the lower landing pad 140 is disposed between the channel structure 130 and the bit line 110. In some embodiments, forming the channel structure 130 includes forming an opening penetrating the first dielectric layer 2411, the word line 120, and the second dielectric layer 2412. After the opening is formed, a gate dielectric layer 135 can be formed within the opening, and then the channel structure 130 can be formed within the opening defined by the gate dielectric layer 135. In some embodiments, the gate dielectric layer 135 is formed between the word line 120 and the channel structure 130.

In operation 46, an upper landing pad 150 is formed on the channel structure 130. That is, the channel structure 130 is between the upper landing pad 150 and the lower landing pad 140.

In operation 47, a trench capacitor 160 is formed on the channel structure 130. In some embodiments, the trench capacitor 160 is disposed on the upper landing pad 150. That is, the upper landing pad 150 is disposed between the trench capacitor 160 and the channel structure 130.

In operation 48, a conductive layer is formed on the trench capacitor. For example, referring to FIG. 1A, a conductive layer 180 is formed on the trench capacitor 160 in operation 48.

In operation 49, a contact 250 is formed on the conductive layer (for example, the conductive layers 220 and/or 230). The contact 250 is spaced apart from the channel structure 130.

One aspect of the present disclosure provides a semiconductor device. The semiconductor device includes a substrate, a first bit line disposed on the substrate and extending along a first direction, a first word line disposed on the first bit line and extending along a second direction perpendicular to the first direction, a channel structure disposed on the first bit line and penetrating the first word line, and a trench capacitor disposed on the channel structure. The channel structure is separated from the first word line by a gate dielectric layer.

Another aspect of the present disclosure provides a semiconductor device. The semiconductor device includes a substrate, a channel structure disposed on the substrate, a first word line disposed on the substrate and surrounding the channel structure, and a trench capacitor disposed on the channel structure, opposite to the substrate. The channel structure tapers along a first direction away from the trench capacitor.

Another aspect of the present disclosure provides a semiconductor device. The semiconductor device includes a substrate, a first bit line disposed on the substrate, a first landing pad disposed on the first bit line, a second landing pad disposed above the first landing pad, and a channel structure disposed between the first landing pad and the second landing pad.

Another aspect of the present disclosure provides a method for manufacturing a semiconductor device. The method includes providing a substrate; forming a first bit line on the substrate, wherein the first bit line extends along a first direction; forming a first word line above the first bit line, wherein the first word line extends along a second direction perpendicular to the first direction; forming a channel structure on the first bit line, wherein the channel structure penetrates the first word line; and forming a trench capacitor on the channel structure.

The embodiments of the present disclosure provide a semiconductor device with the capacitor formed last, thereby differentiating process and structure thereof from current practice. For example, in the current practice, the contact connecting the memory array to other elements is manufactured by stacking several contacts and stages, while the present disclosure provides a monolithic contact connecting to the memory array, whereby misaligned (failed) contacts can be avoided. Furthermore, as the word line of the present disclosure is close to the lower conductive layers on the substrate, the resistance of the connection can be reduced due to the shortened electrical path (shorter word line contact).

As to the potential failure of channel structure, the etching process for manufacturing the channel structure may be not deep enough; in such case, the bottom surface of the channel structure can contact the word line, such that the channel structure and the word line are shorted. In current practice, since the bit line is disposed on the channel structure, a short circuit may occur between the bit line and the word line through the failed channel structure, and thus other channel structures connected to the same bit line would fail as well. The present disclosure provides a semiconductor device with the capacitor formed last (i.e., the capacitor disposed on the channel structure). In this case, a short circuit may occur between the word line and the capacitor (instead of the bit line) through the failed channel structure, and thus only one memory cell (containing the failed channel structure) would be impacted. Accordingly, yield and performance of the semiconductor device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:

a substrate;

a first bit line disposed on the substrate;

a first landing pad disposed on the first bit line;

a second landing pad disposed above the first landing pad;

a channel structure disposed between the first landing pad and the second landing pad; and a titanium nitride layer disposed between the first landing pad and the first bit line;

wherein the first landing pad has a tapered shape that a width of the first landing pad is gradually reduced toward the channel structure;

wherein the second landing pad has a tapered shape that a width of the second landing pad is gradually increased toward the channel structure;

wherein a width of the titanium nitride layer is greater than the width of the first landing pad.

2. The semiconductor device of claim 1, further comprising:

a first dielectric layer disposed on the substrate, wherein the first landing pad is disposed within the first dielectric layer;

a second dielectric layer disposed over the first dielectric layer, wherein the second landing pad is disposed within the first dielectric layer;

a word line disposed between the first dielectric layer and the second dielectric layer, wherein the channel structure is extended from the first dielectric layer to the second dielectric layer through the word line;

wherein the first landing pad is aligned with the second landing pad in a cross-sectional perspective.

3. The semiconductor device of claim 1, wherein the channel structure has a first diameter adjacent to the first landing pad and a second diameter adjacent to the second landing pad, wherein the second diameter is greater than the first diameter, wherein the first diameter is less than the width of the first landing pad while the second diameter is less than the second landing pad, wherein the bit line has a tapered shape that a width of the bit line is gradually reduced toward the channel structure.

4. The semiconductor device of claim 1, further comprising:

a first ITO layer disposed between the channel structure and the first landing pad; and a second ITO layer disposed between the channel structure and the second landing pad.

5. The semiconductor device of claim 1, further comprising a dielectric layer disposed on the second landing pad and exposing the second landing pad; and a capacitor cell penetrating the dielectric layer and disposed on the second landing pad;

wherein the capacitor cell comprises a first conductive layer in contact with the second landing pad, a first capacitor cell dielectric layer disposed on the first conductive layer, and a second conductive layer disposed on the first capacitor cell dielectric layer.

6. The semiconductor device of claim 5, wherein the capacitor cell has a first width adjacent to the second landing pad, and the second landing pad has a second width equal to or less than the first width.

7. The semiconductor device of claim 5, further comprising a polysilicon layer disposed on the dielectric layer and connected to the second conductive layer of the capacitor cell, wherein the polysilicon layer has a first sidewall.

8. The semiconductor device of claim 7, further comprising a third conductive layer disposed on the polysilicon layer, wherein the first conductive layer has a second sidewall, and wherein the first sidewall is recessed from the second sidewall of the third conductive layer, wherein the first sidewall is non-planar.

9. A method for manufacturing a semiconductor device, comprising:

providing a substrate;

forming a first bit line on the substrate, wherein the first bit line extends along a first direction;

forming a first word line above the first bit line, wherein the first word line extends along a second direction perpendicular to the first direction;

forming a channel structure on the first bit line, wherein the channel structure penetrates the first word line, wherein the first bit line has a tapered shape that a width of the first bit line is gradually reduced toward the channel structure;

forming a trench capacitor on the channel structure; and forming a first landing pad (LP) between the channel structure and the first bit line, wherein the first landing pad has a tapered shape that a width of the first landing pad is gradually reduced toward the channel structure.

10. The method of claim 9, further comprising:

forming a first dielectric layer between the first bit line and the first word line, wherein a bottom end of the channel structure is disposed within the first dielectric layer; and forming a second dielectric layer on the first word line, wherein a top end of the channel structure is disposed within the second dielectric layer.

11. The method of claim 10, further comprising:

forming an opening penetrating the first dielectric layer, the first word line, and the second dielectric layer; and forming a gate dielectric layer within the opening, wherein the gate dielectric layer is formed between the first word line and the channel structure.

12. The method of claim 9, further comprising:

forming an indium tin oxide (ITO) layer between the channel structure and the first landing pad; and a titanium nitride layer disposed between the first landing pad and the first bit line, wherein a width of the titanium nitride layer is greater than the width of the first landing pad.

13. The method of claim 9, further comprising forming a second landing pad (LP) between the trench capacitor and the channel structure, wherein the second landing pad has a tapered shape that a width of the second landing pad is gradually increased toward the channel structure.

14. The method of claim 9, further comprising forming a first conductive layer between the substrate and the first bit line; and forming a first contact on the first conductive layer, wherein the first contact is spaced apart from the channel structure.

15. The method of claim 9, further comprising:

forming a second conductive layer on the trench capacitor.

16. The method of claim 9, wherein the channel structure tapers along a third direction away from the trench capacitor.

* * * * *